(12) United States Patent
Cambou et al.

(10) Patent No.: US 9,702,944 B2
(45) Date of Patent: Jul. 11, 2017

(54) APPARATUS AND METHOD FOR SENSING A MAGNETIC FIELD USING ARRAYS OF MAGNETIC SENSING ELEMENTS

(71) Applicant: Crocus Technology Inc., Santa Clara, CA (US)

(72) Inventors: Bertrand F. Cambou, Palo Alto, CA (US); Reuven Yehoshua, Sunnyvale, CA (US); Yaron Oren-Pines, San Jose, CA (US); Douglas Lee, San Jose, CA (US)

(73) Assignee: Crocus Technology Inc., Santa Clara, CA (US)

( * ) Notice: Subject to any disclaimer, the term of this patent is extended or adjusted under 35 U.S.C. 154(b) by 131 days.

(21) Appl. No.: 14/801,792

(22) Filed: Jul. 16, 2015

(65) Prior Publication Data

US 2016/0018479 A1      Jan. 21, 2016

Related U.S. Application Data

(60) Provisional application No. 62/025,952, filed on Jul. 17, 2014.

(51) Int. Cl.
*G01R 33/02* (2006.01)
*G01R 33/09* (2006.01)
*G11C 11/16* (2006.01)

(52) U.S. Cl.
CPC ........ *G01R 33/098* (2013.01); *G11C 11/1659* (2013.01)

(58) Field of Classification Search
CPC .......................... G01R 33/098; G01R 33/093; G01R 33/0029; G01R 33/09; G01R 33/096;
(Continued)

(56) References Cited

U.S. PATENT DOCUMENTS 9,228,855 B2    1/2016   Cambou et al.
9,330,748 B2    5/2016   Roizin et al.
(Continued)

FOREIGN PATENT DOCUMENTS

WO    2013/134410 A1    9/2013
WO    2013134410 A1     9/2013

OTHER PUBLICATIONS

Search Report issued to European Patent Application No. EP 15177104, Jun. 6, 2016, 10 pgs.
(Continued)

*Primary Examiner* — Patrick Assouad
*Assistant Examiner* — Demetrius Pretlow
(74) *Attorney, Agent, or Firm* — Cooley LLP

(57) ABSTRACT

An apparatus includes circuits and a module configured to determine an external magnetic field based on a parameter of each circuit. Each circuit includes an array of magnetic tunnel junctions partitioned into subarrays. The magnetic tunnel junctions in each subarray are arranged in rows, the magnetic tunnel junctions in each row are connected in series, and the rows are connected in parallel. The subarrays are connected in series. Each magnetic tunnel junction includes a storage layer having a storage magnetization and a sense layer having a sense magnetization. Each magnetic tunnel junction is configured such that the sense magnetization and impedance of each magnetic tunnel junction vary in response to an external magnetic field. The parameter of each circuit varies based on a combined impedance of the multiple magnetic tunnel junctions. The module is implemented in at least one of a memory or a processing device.

22 Claims, 22 Drawing Sheets

(58) Field of Classification Search
CPC .............. G01R 33/0023; G01R 15/205; G01R 33/0052; H01L 27/2221; H01L 43/08
USPC ...... 324/207.11, 252, 207.21, 244, 249, 260, 324/262, 207.12; 365/5, 158, 171, 173; 257/421–427; 338/32 R, 32 H See application file for complete search history.

(56) References Cited

U.S. PATENT DOCUMENTS

| | | | |
|---|---|---|---|
| 9,395,210 | B2 | 7/2016 | Cambou et al. |
| 2003/0094944 | A1 | 5/2003 | Suzuki et al. |
| 2005/0104104 | A1* | 5/2005 | Schultz ............... H01L 21/8213 257/295 |
| 2008/0272771 | A1 | 11/2008 | Guo et al. |
| 2008/0299904 | A1 | 12/2008 | Yi et al. |
| 2009/0067229 | A1 | 3/2009 | Kang et al. |
| 2009/0244965 | A1 | 10/2009 | Reohr |
| 2010/0254181 | A1* | 10/2010 | Chung ..................... G11C 8/08 365/158 |
| 2010/0265759 | A1* | 10/2010 | Chung ..................... G11C 11/16 365/158 |
| 2011/0007561 | A1 | 1/2011 | Berger et al. |
| 2012/0068698 | A1 | 3/2012 | Chen et al. |
| 2012/0314487 | A1 | 12/2012 | El Baraji et al. |
| 2013/0094283 | A1* | 4/2013 | Berger ..................... G11C 8/08 365/158 |
| 2014/0062472 | A1 | 3/2014 | Nishikawa |
| 2015/0325624 | A1* | 11/2015 | Roizin ................... H01L 43/10 257/421 |
| 2016/0163431 | A1* | 6/2016 | Zhou ....................... H01L 43/08 338/32 R |

OTHER PUBLICATIONS

Search Report issued to European Patent Application No. EP 15177114, Jun. 6, 2016, 10 pgs.
Search Report issued to European Patent Application No. EP 15177124, Jun. 2, 2016, 9 pgs.
Search Report issued to European Patent Application No. EP 15177129, Jun. 2, 2016, 9 pgs.
Search Report issued to European Patent Application No. EP 15177137, Jun. 2, 2016, 8 pgs.

* cited by examiner

APPARATUS AND METHOD FOR SENSING A MAGNETIC FIELD USING ARRAYS OF MAGNETIC SENSING ELEMENTS

CROSS REFERENCE TO RELATED APPLICATIONS

This application claims priority to U.S. Provisional patent application No. 62/025,952 filed Jul. 17, 2014, the contents of which are incorporated herein by reference.

FIELD OF THE INVENTION

The invention relates generally to magnetic field sensors and, more particularly, to magnetic field sensors including arrays of magnetic field sensing elements configured to sense a magnetic field.

BACKGROUND

Magnetic field sensors can exhibit various characteristics of an external magnetic field. There is a range of applications for magnetic field sensing with a wide range of output voltage, current, and/or power requirements. It can be desirable to amplify the output of these sensors to sufficiently high levels while avoiding breakdown of devices within these sensors, and while being robust against failure of individual devices within these sensors. It is also desirable to have a scalable design approach for these sensors. It is also desirable to integrate these sensors into systems that can leverage their capabilities.

It is against this background that a need arose to develop the magnetic field sensors including arrays of magnetic field sensing elements configured to sense a magnetic field and related methods described herein.

SUMMARY OF THE INVENTION

One aspect of the invention relates to an apparatus including a plurality of circuits and a module configured to determine an external magnetic field based on a parameter of each of the plurality of circuits. Each of the plurality of circuits includes an array of magnetic tunnel junctions partitioned into a plurality of subarrays. The magnetic tunnel junctions in each of the plurality of subarrays are arranged in a plurality of rows, the magnetic tunnel junctions in each of the plurality of rows are connected in series, and the plurality of rows are connected in parallel. The plurality of subarrays are connected in series. Each magnetic tunnel junction includes a storage layer having a storage magnetization and a sense layer having a sense magnetization. Each magnetic tunnel junction is configured such that the sense magnetization and impedance of each magnetic tunnel junction vary in response to an external magnetic field. The parameter of each of the plurality of circuits varies based on a combined impedance of the multiple magnetic tunnel junctions. The module is implemented in at least one of a memory or a processing device.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

DETAILED DESCRIPTION OF EMBODIMENTS OF THE INVENTION

Figure 1:
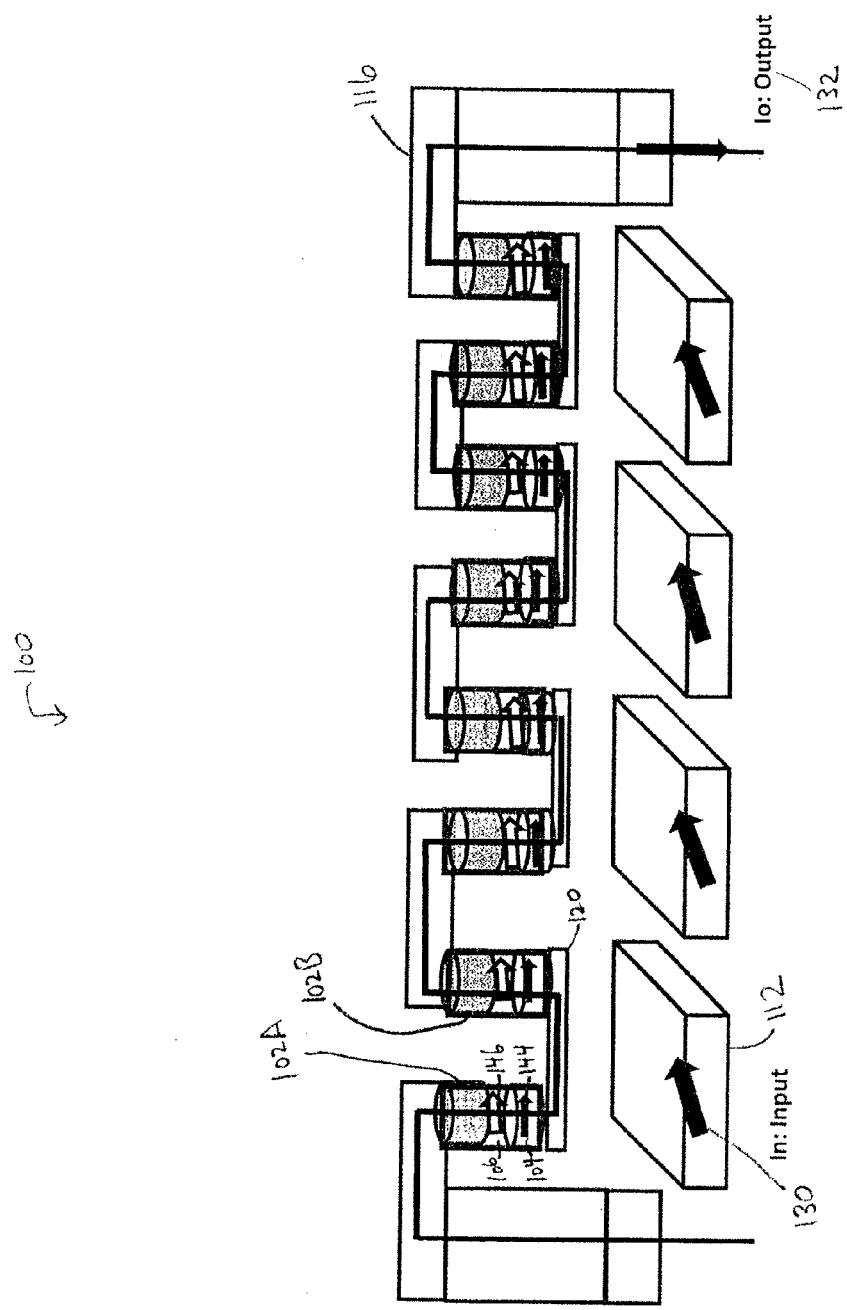
FIG. 1 illustrates a perspective view of a magnetic field sensing array, according to an embodiment of the invention.
Figure 2A:
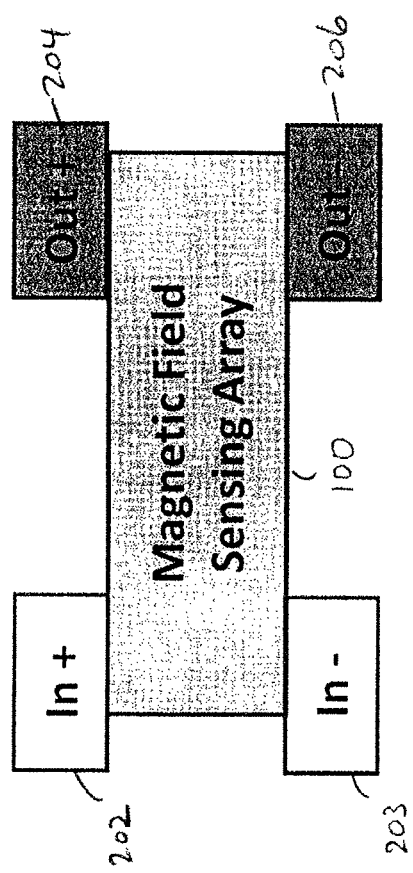
FIG. 2A illustrates a logical block diagram of a magnetic field sensing array, according to an embodiment of the invention.
Figure 2B:
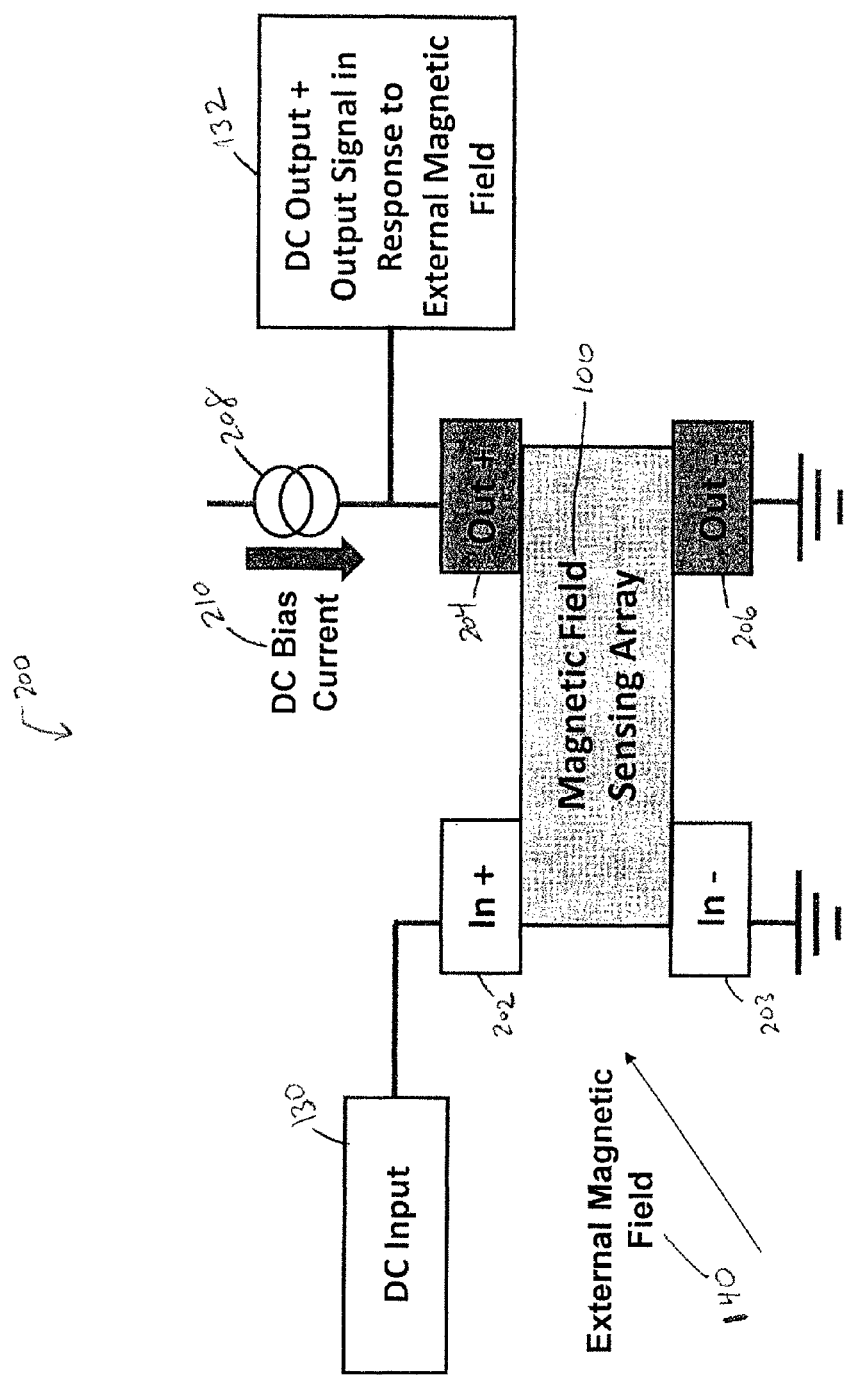
FIG. 2B illustrates a logical block diagram of a magnetic field sensing module including the magnetic field sensing array, according to an embodiment of the invention.

FIG. 1 illustrates a perspective view of a magnetic field sensing array 100, according to an embodiment of the invention. FIG. 2A illustrates a logical block diagram of a magnetic field sensing array 100, according to an embodiment of the invention. FIG. 2B illustrates a logical block diagram of a magnetic field sensing module 200 including the magnetic field sensing array 100, according to an embodiment of the invention. Referring to FIGS. 1, 2A, and 2B, the magnetic field sensing array 100 may include one or more magnetic field sensing elements 102. In the embodiment of FIG. 1, the magnetic field sensing elements 102A and 102B are shown connected by a conductive strap 120. In one embodiment, the magnetic field sensing elements 102 are implemented as magnetic tunnel junctions (MTJs). The magnetic field sensing elements 102 may be referred to as magnetic logic units (MLUs).

Figure 10:
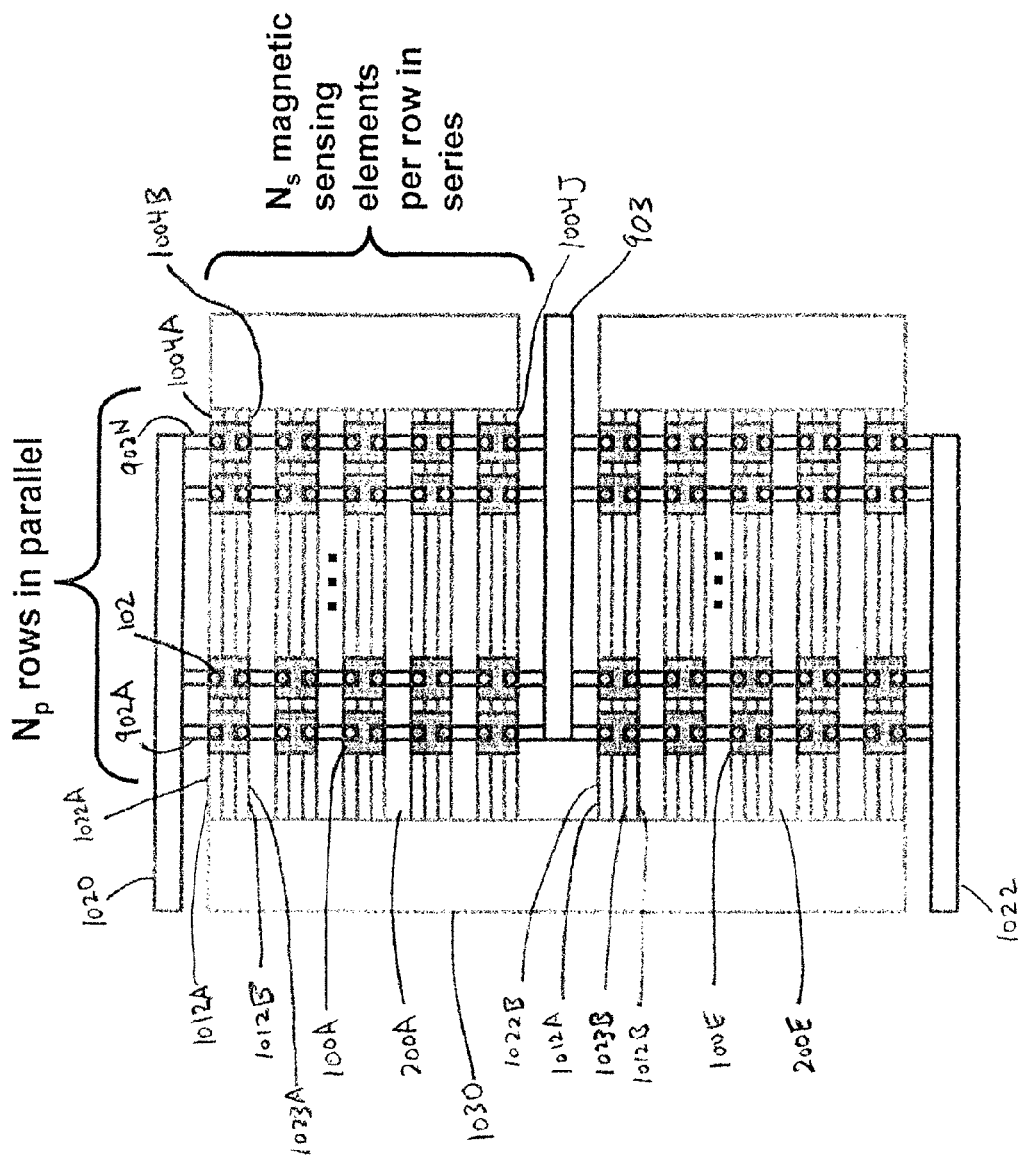
FIG. 10 illustrates an expanded layout view of the pair of magnetic field sensing modules of FIG. 9, according to an embodiment of the invention.

For example, referring to FIG. 10, arrays of large numbers of magnetic field sensing elements 102 are contemplated. In the example of FIG. 10, these magnetic field sensing elements 102 may be arranged in an array with Np parallel rows of magnetic field sensing elements 102, each row having Ns magnetic field sensing elements 102 in series. This array may be compact. For example, 50,000 magnetic field sensing elements 102 may fit in a footprint with an area in the range from about 0.1 to about 0.5 square millimeters.

The magnetic field sensing array 100 may be an N-terminal device, where N is four, five, six, or a larger integer number of terminals. Referring to FIG. 2A, in one embodiment the magnetic field sensing array 100 may be a four-terminal device having input terminals 202 and 203 and output terminals 204 and 206. None of these four terminals is in common with any other of these four terminals. (For example, neither of the input terminals 202 and 203 need to share a ground connection with either of the output terminals 204 and 206.) Each of the four terminals may be concurrently connected to distinct portions of a surrounding circuit.

The magnetic field sensing module 200 shown in FIG. 2B is one example of how the magnetic field sensing array 100 can be used as a building block of magnetic field sensing devices. A magnetic field sensing device, for example, can determine either or both of magnitude and direction of an external magnetic field incident on the magnetic field sensing device. A magnetic field sensing device also responds to variations in frequency, phase and amplitude of an external magnetic field. Referring to FIGS. 1 and 2B, an input signal 130 may be applied to the magnetic field sensing module 200 through a field line 112. Referring to FIG. 2A, the input signal 130 may be applied to the first terminal 202. The input signal 130 may be a DC bias signal that configures an operating point of the magnetic field sensing module 200 by configuring an impedance of each of the magnetic field sensing elements 102, and also a combined impedance of the magnetic field sensing array 100, in the absence of external magnetic field 140. For example, the input signal 130 may be an input DC bias current that flows through the field line 112, where the input current generates a magnetic field that couples to each of the magnetic field sensing elements 102 to configure the impedance of each of the magnetic field sensing elements 102 in the absence of the external magnetic field 140, and thereby to configure the operating point of the magnetic field sensing module 200.

In one embodiment, the external magnetic field 140 changes impedance of one or more of the magnetic field sensing elements 102, and also the combined impedance of the magnetic field sensing array 100. The combined impedance of the magnetic field sensing array 100 can vary due to an external magnetic field 140 that is substantially constant, or due to an external magnetic field 140 that varies with time. An amplified output signal 132 of the magnetic field sensing module 200 may flow through output line 116, and may be measured across output terminals 204 and 206. The magnetic field sensing module 200 may include bias circuitry that supplies DC power, and that facilitates setting an input-output transfer characteristic and an operating point for the magnetic field sensing module 200, such as by setting the DC input current. The bias circuitry may include circuitry 208 that supplies a DC bias current 210 to facilitate generation of the output signal 132. However, the magnetic field sensing array 100 itself may not contain any silicon transistors, as none are needed to drive each magnetic field sensing element 102. The magnetic field sensing array 100 may be solely driven externally through its input and output terminals.

Referring to FIGS. 1 and 2B, an individual magnetic field sensing element 102 implemented as a single MTJ cell may, in one example, have a power attenuation of about −2 dB. At the same time, the feed forward coupling capacitance between input and output of each magnetic field sensing element 102 is very small. To increase the gain of the magnetic field sensing module 200 while maintaining a very small coupling capacitance, many magnetic field sensing elements 102 may be linked together. In one embodiment, arrays of magnetic field sensing elements 102 are used to design magnetic field sensing modules 200 that can provide large gains, such as for providing a high voltage output in response to the external magnetic field 140, and extended cutoff frequencies, such as for providing an output that includes frequency variations corresponding to high frequency variations in the external magnetic field 140.

Referring to FIG. 1, the magnetic field sensing element 102 can be implemented with one magnetization, namely a storage magnetization 146, that is aligned in a particular stored direction. The magnetic field sensing element 102 can be implemented with another magnetization, namely a sense magnetization 144, that is aligned by a magnetic field generated by the input current corresponding to the input signal 130. This type of magnetic field sensing element 102 is known as self-referenced. Alternatively, the magnetic field sensing element 102 can be implemented with the storage magnetization 146 and a reference magnetization.

The magnetic field sensing element 102 includes a sense layer 104, a storage layer 106, and a layer 908 (see FIG. 3) that is disposed between the sense layer 104 and the storage layer 106. Other implementations of the magnetic field sensing element 102 are contemplated. For example, the relative positioning of the sense layer 104 and the storage layer 106 can be reversed, with the storage layer 106 disposed below the sense layer 104.

Figure 3:
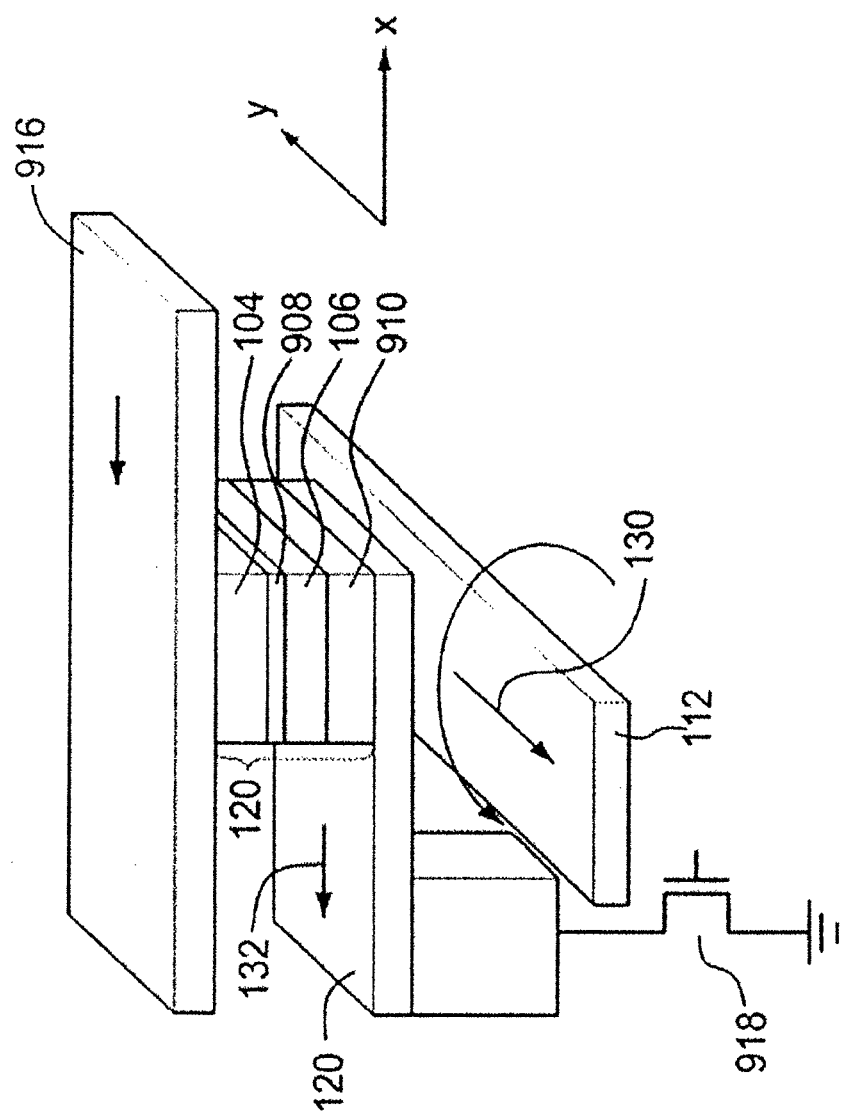
FIG. 3 illustrates a perspective view of a magnetic field sensing element and supporting circuitry that may be included in the magnetic field sensing module, according to an embodiment of the invention.

FIG. 3 illustrates a perspective view of the magnetic field sensing element 102 and supporting circuitry that may be included in the magnetic field sensing array 100, according to an embodiment of the invention. Referring to FIGS. 1 and 3, each of the sense layer 104 and the storage layer 106 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 104 and the storage layer 106 can include the same ferromagnetic material or different ferromagnetic materials. As illustrated in FIG. 1, the sense layer 104 can include a soft ferromagnetic material, namely one having a relatively low coercivity, while the storage layer 106 can include a hard ferromagnetic material, namely one having a relatively high coercivity. In such manner, a magnetization of the sense layer 104 can be readily varied under low-intensity magnetic fields generated in response to the input signal 130, while a magnetization of the storage layer 106 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 104 and the storage layer 106 can be in the nm range, such as from about 1 nm to about 20 nm or from about 1 nm to about 10 nm. Other implementations of the sense layer 104 and the storage layer 106 are contemplated. For example, either, or both, of the sense layer 104 and the storage layer 106 can include multiple sub-layers in a fashion similar to that of the so-called synthetic antiferromagnetic layer.

In another embodiment, the magnetic field sensing element 102 may include the storage layer 106 and a reference layer instead of the sense layer 104, with the layer 908 disposed between the storage layer 106 and the reference layer. Each of the reference layer and the storage layer 106 includes, or is formed of, a magnetic material and, in particular, a magnetic material of the ferromagnetic type, the characteristics of which are described previously. In general, the reference layer and the storage layer 106 can include the same ferromagnetic material or different ferromagnetic materials. The reference layer is different from the sense layer 104 in that the reference layer typically has a high coercivity, such as a coercivity higher than the storage layer 106.

The layer 908 functions as a tunnel barrier, and includes, or is formed of, an insulating material. Suitable insulating materials include oxides, such as aluminum oxide (e.g., $Al_2O_3$) and magnesium oxide (e.g., MgO). A thickness of the layer 908 can be in the nm range, such as from about 1 nm to about 10 nm.

Referring to FIGS. 1 and 3, the magnetic field sensing element 102 also includes the pinning layer 910, which is disposed adjacent to the storage layer 106 and, through exchange bias, stabilizes the storage magnetization along a particular one of the pair of directions when a temperature within, or in the vicinity of, the pinning layer 910 is lower than a temperature $T_{BS}$. The temperature $T_{BS}$ can correspond to a blocking temperature, a Neel temperature, or another threshold temperature. The pinning layer 910 unpins, or decouples, the storage magnetization direction when the temperature is at, or above, the blocking temperature $T_{BS}$, thereby allowing the storage magnetization direction to be switched to another one of the pair of directions.

In one embodiment, such a pinning layer is omitted adjacent to the sense layer 104, and, as a result, the sense layer 104 has a sense magnetization direction that is unpinned and is readily varied, with the substantial absence of exchange bias.

In another embodiment, as previously described, the magnetic field sensing element 102 includes a reference layer instead of the sense layer 104. In this embodiment, an additional pinning layer may be disposed adjacent to the reference layer. This additional pinning layer may be characterized by a threshold temperature $T_{BR}$, with $T_{BR} > T_{BS}$. The temperature $T_{BR}$ can correspond to a blocking temperature, a Neel temperature, or another threshold temperature. Through exchange bias, this additional pinning layer stabilizes the reference magnetization along a substantially fixed direction at temperatures lower than the threshold temperature $T_{BR}$.

The pinning layer 910 (and the additional pinning layer disposed adjacent to the reference layer in the alternative embodiment) includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature $T_{BS}$ of alloys based on Ir and Mn (or based on Fe and Mn) can be in the range of about 120° C. to about 220° C. or about 150° C. to about 200° C., such as about 200° C., and can be smaller than the blocking temperature $T_{BS}$ of alloys based on Pt and Mn (or based on Ni and Mn), which can be in the range of about 300° C. to about 350° C.

Figure 4:
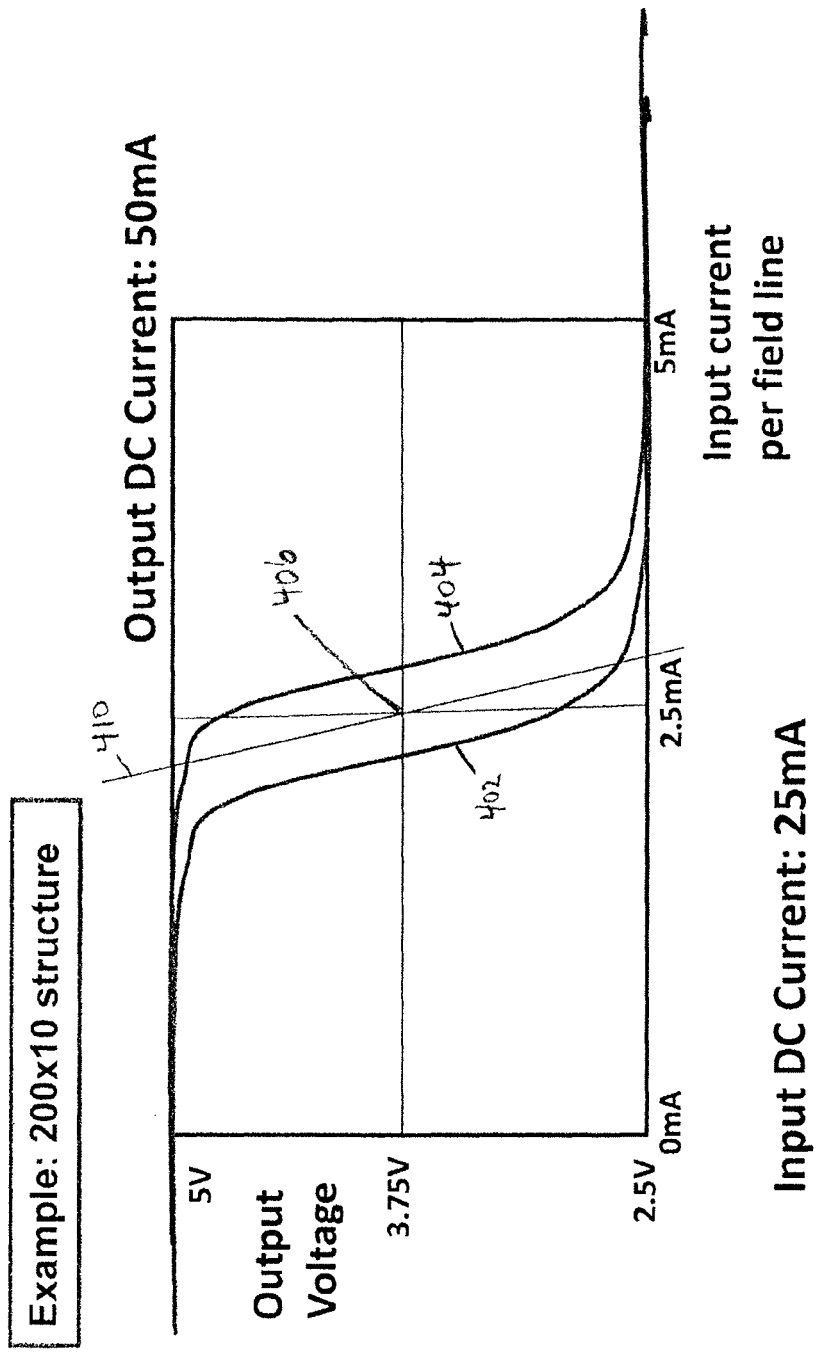
FIG. 4 illustrates an example of a response curve relating an output signal of the magnetic field sensing module to an operating point defined by an input signal to the magnetic field sensing module, according to an embodiment of the invention.

Referring to FIGS. 1, 2A, 2B, and 3, thermally assisted switching (TAS) technology, as applied to magnetic field sensing elements 102, provides one way of implementing a device with impedance that varies in response to the external magnetic field 140 around an operating point configured by the input signal 130 for use in magnetic field sensors, as explained herein. FIG. 4 illustrates an example of a response curve (an input-output transfer characteristic) relating an output signal 132 of the magnetic field sensing module 200 to an operating point configured by the input signal 130, according to an embodiment of the invention. The below discussion of FIG. 4 illustrates the input-output transfer characteristic of the magnetic field sensing array 100, and is applicable to magnetic field sensing arrays 100 included in any of the magnetic field sensors described herein. In the example of FIG. 4, the magnetic field sensing array 100 includes an array of magnetic field sensing elements 102 with 200 parallel rows of magnetic field sensing elements 102, each row having 10 magnetic field sensing elements 102 in series (see, for example, FIG. 10 with Np equal to 200 and Ns equal to 10), and the output signal 132 of the magnetic field sensing module 200 is measured across the magnetic field sensing array 100.

In one embodiment, the input signal 130 to input terminal 202 of the magnetic field sensing array 100 may flow through one or more field lines 112 (such as the ten field lines 1012A shown in FIG. 10) such that a magnetic field generated by the input signal is coupled to each of the magnetic field sensing elements 102. Alternatively or in addition, another input signal to input terminal 203 of the magnetic field sensing array 100 may flow in the opposite direction through the one or more field lines 112 such that a magnetic field generated by the another input signal is also coupled to each of the magnetic field sensing elements 102.

In one embodiment, the field line 112 may be positioned about 50 nm underneath the strap 120.

When the input signal 130 is zero (e.g., zero input current assuming that the input signal 130 to the input terminal 202 is the only input to the magnetic field sensing array 100), the sense magnetization 144 and the storage magnetization 146 of each of the magnetic field sensing elements 102 included in the magnetic field sensing array 100 are naturally substantially anti-aligned (e.g., substantially antiparallel), resulting in a series impedance of 2 KΩ per magnetic field sensing element 102 included in the magnetic field sensing array 100. When the input signal 130 is sufficiently small (e.g., less than a value in the range from about 2 mA to about 2.25 mA per field line 112 in the example of FIG. 4), the sense magnetization 144 and the storage magnetization 146 of each of the magnetic field sensing elements 102 included in the magnetic field sensing array 100 remain substantially antiparallel, resulting in a series impedance of about 2 KΩ per magnetic field sensing element 102. When the input signal 130 is sufficiently large (greater than a value in the range from about 2.75 mA to about 3 mA per field line 112 in the example of FIG. 4), the sense magnetization 144 becomes substantially aligned (e.g., substantially parallel) with the storage magnetization 146, resulting in a series impedance of about 1 KΩ per magnetic field sensing element 102 included in the magnetic field sensing array 100. It is contemplated that these impedance values, and in particular the ratio between these impedance values, may be varied for other embodiments of the magnetic field sensing elements 102 based on forming the sense layer 104, the storage layer 106, and/or the layer 108 from different choices of materials, material concentrations, and/or material thicknesses.

In the example of FIG. 4, and also referring to FIG. 2B, the input signal 130 includes 2.5 mA DC bias current to configure the operating point of the magnetic field sensing module 200. In other embodiments, the operating point may be configured by other values of the input signal 130, depending on factors including but not limited to the impedance values of the magnetic field sensing elements 102 and the Np and Ns parameters of the magnetic field sensing array 100.

In addition, in one embodiment, the sense magnetizations 144 of the magnetic field sensing elements 102 may vary in response to the external magnetic field 140, and as a result the combined impedance of the magnetic field sensing elements 102 included in the magnetic field sensing array 100 may also vary in response to the external magnetic field 140. In another embodiment in which the magnetic field sensing elements 102 include a reference layer and the storage layer 106 instead of the sense layer 104 and the storage layer 106, the storage magnetizations 146 of the magnetic field sensing elements 102 (and thus the combined impedance of the magnetic field sensing elements 102 included in the magnetic field sensing array 100) may vary in response to the external magnetic field 140 if the magnetic field sensing elements 102 are heated above the blocking temperature $T_{BS}$, as previously described. The DC bias current 210 flows through the magnetic field sensing array 100, generating an output voltage based on the variation of the combined impedance of the magnetic field sensing elements 102 included in the magnetic field sensing array 100. The output signal 132 may be this output voltage signal, or alternatively may be an output current signal generated based on this output voltage signal. In the example shown in FIG. 4, the response curve relating the output signal 132 of the magnetic field sensing module 200 to the input signal 130 has a substantially linear region 410 around 2.5 mA input current per field line 112 that has a slope of about 5 Volts/mA.

The substantially linear region 410 may be formed as an average of the input-output response curves of multiple magnetic field sensing elements 102. In the example of FIG. 4, each magnetic field sensing element 102 switches over a different input current range. For example, magnetic field sensing elements 102 may switch over input currents in the range from about 2 mA to about 2.75 mA per field line 112 on the lower end 402, and in the range from about 2.25 mA to about 3 mA per field line 112 on the higher end 404 as shown in FIG. 4. To stay in the linear region of the IV response curve, the output voltage swing resulting from this input current swing may be up to about 80% of the full output voltage range. It is contemplated that these input current ranges may be varied across embodiments of the magnetic field sensing element 102 based on forming the sense layer 104, the storage layer 106, and/or the layer 108 from different choices of materials, material concentrations, and/or material thicknesses. For example, these input current ranges may typically vary from those shown in FIG. 4 to an input current range around a DC current of about 5 mA.

In one embodiment, a magnetic field sensing array 100 included in a magnetic field sensor may be biased for small signal operation, such that an output 132 of the magnetic field sensing array 100 varies substantially linearly with an external magnetic field 140 around an operating point of the magnetic field sensing module 200 configured by a DC bias input 130 to the magnetic field sensing module 200. Alternatively or in addition, the magnetic field sensing array 100 may be biased to substantially maximize gain of the magnetic field sensing module 200, such as for high-voltage applications. Alternatively, the magnetic field sensing array 100 may be biased for large signal operation, such that the output 132 of the magnetic field sensing array 100 varies substantially non-linearly with the external magnetic field 140 around the operating point of the magnetic field sensing module 200 configured by a DC bias input 130 to the magnetic field sensing module 200. For example, the magnetic field sensing array 100 may be biased in saturation or at cut-off.

For example, there are multiple ways to set up the magnetic field sensing module 200, such as linear, saturated, and class C. For linear amplification, such as for class A amplification, the input DC current can be adjusted to an operating point (bias point) where slope of the response curve is the highest (e.g., where a gain of the magnetic field sensing module 200 is substantially maximized). In the example of FIG. 4, this operating point is at about 2.5 mA input current per field line 112. For maximum power efficiency, such as for class C amplification, the input DC current can be adjusted to an operating point where the DC power associated with the DC bias current 210 in the output stage of the magnetic field sensing module 200 is at its minimum, where the operating point remains within the substantially linear region 410. In the example of FIG. 4, this operating point is at about 2.75 mA input current. It is contemplated that averaging of the input-output response curves of many magnetic field sensing elements 102 (such as thousands of magnetic field sensing elements 102 in the example of FIG. 4) in a magnetic field sensing module 200 may result in increased linearity of the substantially linear region 410 of the magnetic field sensing module 200 as compared to the input-output response curve of a single magnetic field sensing element 102. It is also contemplated that averaging of the input-output response curves of many magnetic field sensing elements 102 in each magnetic field sensing module 200 may result in greater uniformity and predictability of the class A and class C operating points across the magnetic field sensing modules 200. It is also contemplated that averaging of the input-output response curves of many magnetic field sensing elements 102 in each magnetic field sensing module 200 may result in greater robustness against failures of individual magnetic field sensing elements 102.

Referring to FIGS. 2B and 4, the output 132, such as a current output and/or voltage output, of each of the magnetic field sensing modules 200 is based on a direction and magnitude of the external magnetic field 140. The input 130 to each magnetic field sensing module 200 can be configured such that the operating point of the magnetic field sensing module 200 remains substantially at a midpoint 406 of the substantially linear region 410 of the I-V response curve shown in FIG. 4, if the magnetic field sensing module 200 is not in the presence of a nonzero external magnetic field 140. At this operating point, the average output impedance (primarily impedance) of the magnetic field sensing elements 102 included in the magnetic field sensing module 200 can be about (Rmax−Rmin)/2, where Rmax is the maximum output impedance (all storage magnetizations and sense magnetizations of the magnetic field sensing elements 102 included in the magnetic field sensing module 200 being substantially anti-aligned), and where Rmin is the minimum output impedance (all storage magnetizations and sense magnetizations of the magnetic field sensing elements 102 included in the magnetic field sensing module 200 being substantially aligned). At this operating point, about half of the magnetic field sensing elements 102 included in the magnetic field sensing module 200 may be substantially aligned (with an impedance of about Rmin), and the remaining magnetic field sensing elements 102 included in the magnetic field sensing module 200 may be substantially anti-aligned (with an impedance of about Rmax), resulting in the average output impedance of the magnetic field sensing module 200 of about (Rmax−Rmin)/2. It is contemplated that each magnetic field sensing module 200 includes many (e.g., thousands) of magnetic field sensing elements 102 to increase the uniformity of average output impedance values across magnetic field sensing modules 200 at the operating point.

When under the influence of the external magnetic field 140, each magnetic field sensing element 102 included in each of the magnetic field sensing modules 200 reacts, in that the magnetization of the sense layer 104 (see FIG. 1) of each of the magnetic field sensing elements 102 can rotate to an extent dependent on the direction and magnitude of the external magnetic field 140. There is an antiparallel component of the magnetization of the sense layer 104 due to coupling with the magnetization of the storage layer 106 (see FIG. 1). As a result, when the external magnetic field 140 is substantially aligned with an average storage magnetization of the magnetic field sensing elements 102 included in a particular magnetic field sensing module 200 (and opposite to the antiparallel coupling component of the magnetization of the sense layers 104), the extent of the rotation of the sense layers 104 can be at its peak for that external magnetic field 140. In one example, assuming that the component of the external magnetic field 140 in the storage magnetization direction 146 (see FIG. 1) is g % of the coupling component of the magnetization of the sense layers 104 of the magnetic field sensing elements 102 included in the magnetic field sensing module 200, the output impedance of the magnetic field sensing module 200 can change (relative to Rmin) by about (g×(Rmax−Rmin)/Rmin) percent. When the external magnetic field 140 is substantially perpendicular to the average storage magnetization of the magnetic field sensing module 200, the magnetic field sensing module 200 can be substantially insensitive to the external magnetic field 140, such as at the operating point where the average output impedance of the magnetic field sensing module 200 is about (Rmax−Rmin)/2. When the external magnetic field 140 is substantially opposed to the average storage magnetization of the magnetic field sensing module 200, the output impedance of the magnetic field sensing module 200 can change (relative to Rmin) by about (g×(Rmin−Rmax)/Rmin) percent.

Referring to FIGS. 1 and 2, the output current per magnetic field sensing element 102 should be low enough to avoid heating the magnetic field sensing elements 102 close to the blocking temperature of the storage layer 106 (or in other embodiments, the reference layer). In the example of FIG. 4, the output current per magnetic field sensing element 102 is set at 250 µA to prevent the stored magnetizations from switching during operation. In the example of FIG. 4 (with Np=200 parallel rows of magnetic field sensing elements 102, each row having Ns=10 magnetic field sensing elements 102 in series), the total DC output current to maintain 250 µA per magnetic field sensing element 102 is (Np×250 µA), or 50 mA. When the DC bias current 210 is configured to be a constant 50 mA applied through the output, the voltage drop is about 2.5 Volts when all of the magnetic field sensing elements 102 are substantially aligned, and swings to about 5 Volts when all of the magnetic field sensing elements 102 are substantially anti-aligned.

Referring to FIGS. 2B and 4, the output power delivered to a load by the magnetic field sensing module 200 depends on the operating point, and impedance matching between the output of the magnetic field sensing module 200 and the load. We now determine a relationship between the output power of the magnetic field sensing module 200 and the output power of an individual magnetic field sensing element 102. The output power of the magnetic field sensing module 200 is:

$$Pout = \Delta(Vout) \times Iout/2 \quad (1)$$

In this example, the magnetic field sensing module 200 has Np parallel rows of magnetic field sensing elements 102, each row having Ns magnetic field sensing elements 102 in series. The voltage drop across the magnetic field sensing module 200 is then:

$$\Delta Vout = Ns \times Rmtj \times I_s \quad (2)$$

where Rmtj is the impedance of each magnetic field sensing element 102 with both domains substantially aligned. In this example Rmtj has a value of approximately 1 kOhm. $I_s$ is the current circulating in each row of Ns magnetic field sensing elements 102 in series. Then the total current circulating through the magnetic field sensing module 200 is:

$$Iout = I_s \times Np \quad (3)$$

The maximum output power delivered by the magnetic field sensing module 200 is:

$$Pout = Ns \times Np \times Rmtj \times I_s^2/2 \quad (4)$$

The right side of this equation can be rewritten in terms of Pmtj, the output power delivered by a single magnetic field sensing element 102:

$$Pout = N \times Pmtj \quad (5)$$

where N is the total number of magnetic field sensing elements 102 in the magnetic field sensing module 200. This analysis indicates that the architecture of the magnetic field sensing module 200 may be highly scalable, as the higher the number of interconnected magnetic field sensing elements 102, the higher the output power of the magnetic field sensing module 200 may be. This analysis also indicates that the output power of the magnetic field sensing module 200 may not be dependent on whether the magnetic field sensing elements 102 are connected in series or in parallel. For example, a magnetic field sensing module 200 including 50,000 magnetic field sensing elements 102 has a Pout of 10 mW for various possible example configurations:

Configuration 1: Np=2,500, Ns=20: ΔVout=0.4V Iout=50 mA Pout=10 mW

Configuration 2: Np=1,000, Ns=50: ΔVout=1.0V Iout=20 mA Pout=10 mW

Configuration 3: Np=500, Ns=100: ΔVout=2.0V Iout=10 mA Pout=10 mW

For configuration 3, for a value of Pin, the power in, of 0.5 µW, the Pout in the linear range may be at least 5 mW, so the resulting gain in power may be 5,000.

As can be seen from the above example, and referring to FIG. 2B, the DC bias current 210 and the peak-to-peak voltage of the output signal 132 for a given maximum output power of the magnetic field sensing module 200 are dependent on the number of parallel rows of magnetic field sensing elements 102, and the number of magnetic field sensing elements 102 in series in each row. The DC bias current 210 and the peak-to-peak voltage of the output signal 132 for a given maximum output power of the magnetic field sensing module 200 are therefore dependent on the combined impedance of the magnetic field sensing elements 102 included in the magnetic field sensing module 200.

The performance of the magnetic field sensing elements 102 can be characterized in terms of tunnel magnetoiresistance (TMR). TMR can be expressed as:

$$TMR = ((Ranti\text{-}parallel) - (Rparallel))/(Rparallel) \quad (7)$$

For an Rparallel of 1 kOhm and an Ranti-parallel of 2 kOhm, the TMR is 100%, which may yield a power added efficiency that is below 50% class C. A TMR of 200% may yield a higher power added efficiency of 66%, and a TMR of 1000% may yield 90%. These higher TMR values may allow the magnetic field sensing module 200 to operate with a lower static DC bias current, minimizing power losses. Increasing TMR may also increase linearity.

Referring to FIGS. 1 and 3, the storage layer 106 may be configured through a configuration operation. This configuration operation may occur during operation of the magnetic field sensing module 200. In one embodiment, during a programming cycle, a relatively small current is applied through the magnetic field sensing element 102 to heat the pinning layer 910 by Ohmic effect. When a temperature of the pinning layer 910 is above a threshold temperature, the direction of the storage magnetization 146 is unpinned, thereby allowing the storage magnetization 146 to be programmed by applying a current through the field line 112 that is magnetically connected to the cell. The storage magnetization 146 can be configured in a first direction by applying the current in one particular direction, and can be configured in a second direction opposite to the first direction by applying the current in an opposite direction. After programming, the magnetic field sensing element 102 is cooled below the threshold temperature, thereby pinning the storage magnetization 146 in the programmed direction.

In addition, a magnetization of the storage layer 106 (or in another embodiment, the reference layer) may be pre-configured, such as in the factory. The storage magnetization 146 may be pre-configured by at least one of an internal magnetic field generated by a field line 112 associated with the magnetic field sensing module 200, an external magnetic field, an internal heating mechanism (such as differential or localized heating, such as using a bit line associated with one or more of the magnetic field sensing elements 102 included in the magnetic field sensing module 200, described below), and an external heating mechanism. Various combinations of the above may be used. For example, pre-configuration may be performed using an internal magnetic field and internal heating may be used. Alternatively or in addition, pre-configuration may be performed using an external magnetic field and internal heating may be used. Alternatively or in addition, pre-configuration may be performed using an external magnetic field and a combination of external heating and internal heating. Alternatively or in addition, pre-configuration may be performed using an internal magnetic field and a combination of external heating and internal heating. Alternatively or in addition, pre-configuration may be performed using a combination of an external magnetic field and an internal magnetic field, and a combination of external heating and internal heating.

Still referring to FIGS. 1 and 3, the magnetic field sensing array 100 may also include a set of traces (or strip conductors) to provide programming functions. Specifically, a bit line 916 is electrically connected to the magnetic field sensing element 102 on the side of the sense layer 104 (or, in an alternative embodiment, the reference layer) and is substantially orthogonal to the field line 112, which is disposed below and magnetically connected to the magnetic field sensing element 102 on the side of the storage layer 106. The bit line 916 may include at least part of the output line 116 of FIG. 1, or may correspond to the output line 116 of FIG. 1. The magnetic field sensing array 100 may further include a transistor 918, which is electrically connected, through the strap 120, to the magnetic field sensing element 102 on the side of the storage layer 106. The transistor 918 is switchable between a blocked mode (OFF) and a conducting mode (ON), thereby allowing the flow of a current through the magnetic field sensing element 102. Other implementations of the magnetic field sensing array 100 are contemplated. For example, the relative orientation of the bit line 916 and the field line 112 can be varied from that illustrated in FIG. 4. As another example, the relative positioning of the bit line 916 and the field line 112 can be reversed, with the field line 112 disposed above the bit line 916.

Referring to FIG. 3, during a TAS-type programming cycle, the magnetic field sensing element 102 is heated by applying a heating current through the magnetic field sensing element 102 via the bit line 916, with the transistor 918 in a conducting mode. The magnetic field sensing element 102 is heated to a temperature above the blocking or threshold temperature $T_{BS}$ of the pinning layer 910, such that a magnetization of the storage layer 106 is unpinned. (In the alternative embodiment, the magnetic field sensing element 102 is heated to a temperature above the blocking or threshold temperature $T_{BS}$ of the pinning layer 910 but below the blocking or threshold temperature $T_{BR}$ of the additional pinning layer, such that a magnetization of the storage layer 106 is unpinned but the magnetization of the reference layer remains fixed.) Simultaneously or after a short time delay, the field line 112 is activated to induce a write magnetic field to switch the storage magnetization from an initial direction to another direction. Specifically, a write current is applied through the field line 112 to induce the write magnetic field to switch the storage magnetization direction, according to the direction of the write current. Because the storage magnetization direction can be aligned according to the write magnetic field, the storage magnetization direction can be switched between multiple directions according to a programming encoding scheme. One possible encoding scheme is implemented with a pair of directions that are displaced by about 180°, such that a "0" is assigned to one of the pair of directions, and a "1" is assigned to another one of the pair of directions.

Once the storage magnetization is switched to a programmed direction, the transistor 918 is switched to a blocked mode to inhibit current flow through the magnetic field sensing element 102, thereby cooling the magnetic field sensing element 102. The write magnetic field can be maintained during cooling of the magnetic field sensing element 102, and can be deactivated once the magnetic field sensing element 102 has cooled below the blocking temperature $T_{BS}$ of the pinning layer 910. Because the storage magnetization direction is pinned by the exchange bias of the pinning layer 910, its orientation remains stable so as to retain the stored magnetization direction.

Other implementations of programming cycles are contemplated. For example, the magnetic field sensing element 102 can be implemented with an anisotropic shape having a relatively high aspect ratio, such as about 1.5 or more. In such an anisotropic-shaped implementation of the magnetic field sensing element 102, the storage magnetization direction can be switched and can remain stable, without requiring the pinning layer 910. As another example, a programming cycle can be carried out by applying a write current through the magnetic field sensing element 102 via the bit line 916, using the so-called spin transfer torque ("STT") effect. In such a STT-type programming cycle, the write current can become spin polarized by passing through a polarizing magnetic layer (not illustrated) or through the sense layer 104, and a magnetization of the storage layer 106 can be switched according to a spin-polarized orientation of the write current. Switching of the storage layer magnetization with the spin-polarized write current also can be combined with a TAS-type programming cycle, such as by heating the magnetic field sensing element 102 above the blocking temperature $T_{BS}$ and then applying the spin-polarized write current through the magnetic field sensing element 102.

Figure 5:
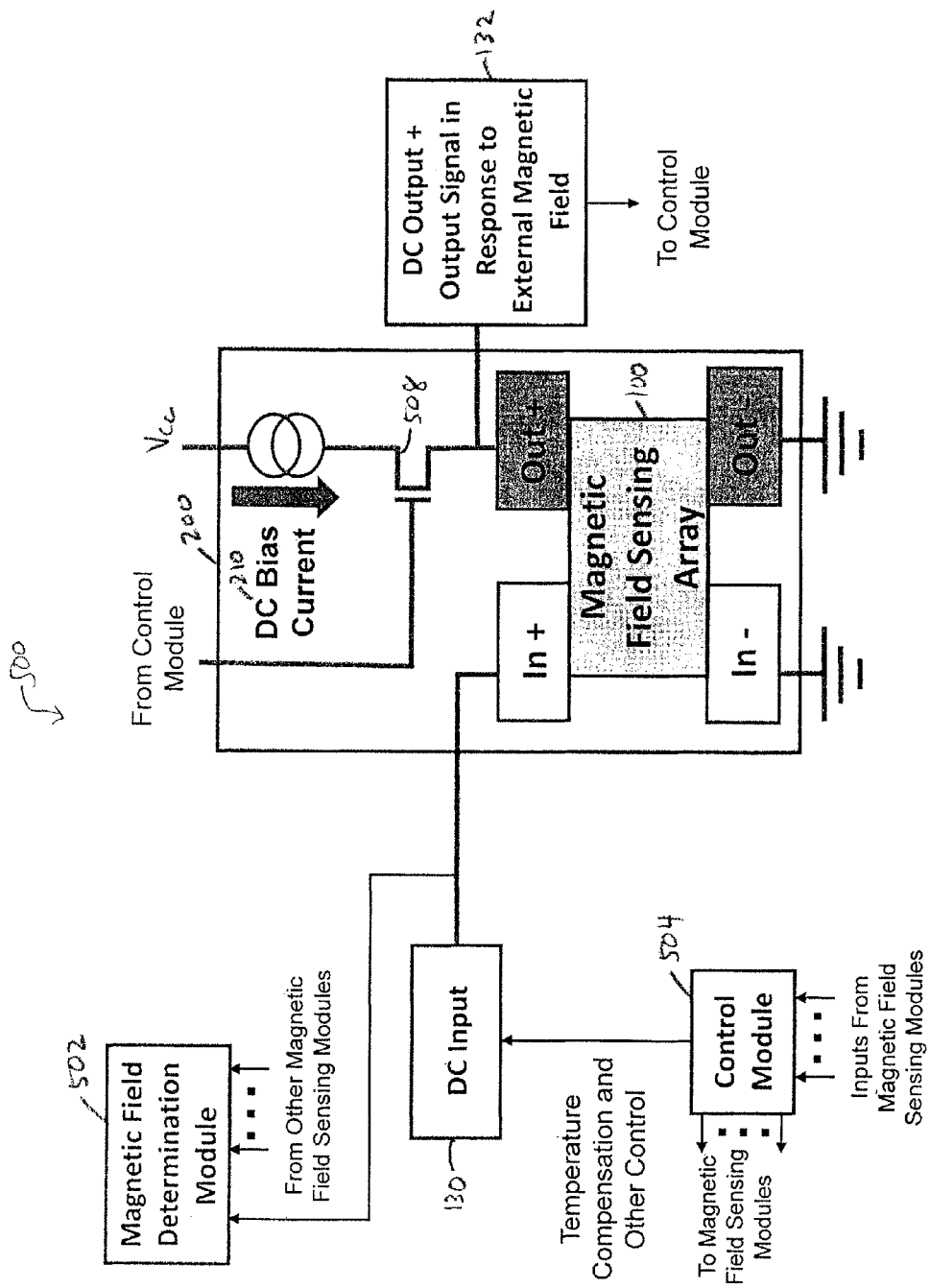
FIG. 5 illustrates a logical block diagram of a magnetic field sensing device showing one of multiple magnetic field sensing modules included in the magnetic field sensing device, according to an embodiment of the invention.
Figure 6:
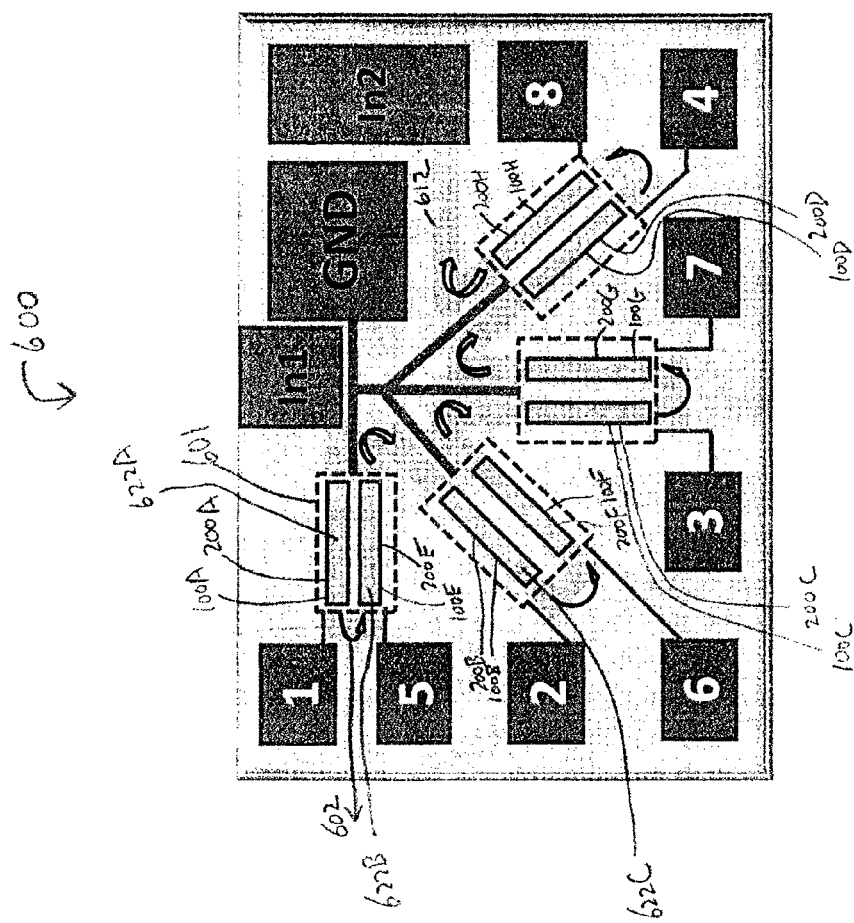
FIG. 6 illustrates a layout view of a magnetic field sensing device including a configuration of magnetic field sensing modules, according to an embodiment of the invention.

FIG. 5 illustrates a logical block diagram of a magnetic field sensing device 500 showing one of multiple magnetic field sensing modules 200 included in the magnetic field sensing device 500, according to an embodiment of the invention. FIG. 6 illustrates a top view of a magnetic field sensing device 600 including a configuration of magnetic field sensing modules 200, according to an embodiment of the invention.

The magnetic field sensing device 500 includes multiple magnetic field sensing modules 200. The magnetic field sensing module 200 may include the magnetic field sensing array 100 (see FIG. 1), or other embodiments of magnetic field sensing arrays previously described. The magnetic field sensing device 600 has the logical structure of the magnetic field sensing device 500. The magnetic field sensing module 200 may include an array of Np rows of magnetic field sensing elements 102 in parallel, with Ns magnetic field sensing elements 102 in series per row (see FIG. 10).

Referring to FIGS. 1 and 6, an average storage magnetization of each of the magnetic field sensing modules 200

(details of the magnetic field sensing modules not shown in FIG. 6) corresponds to a magnetization direction of an average of storage magnetizations 146 (magnetizations of the storage layers 106) of the magnetic field sensing elements 102 included in the each of the magnetic field sensing modules 200. It is contemplated that the magnetic field sensing device 600 is configured such that the magnetic field sensing elements 102 have substantially the same storage magnetizations resulting from magnetic fields generated by current flowing through one or more field lines (such as field lines 612), within the limits of manufacturing tolerances (such as of the magnetic field sensing elements 102) and non-uniformity in the magnetic fields generated by the field lines in the regions in which the magnetic field sensing elements 102 are located.

In one embodiment, the magnetic field sensing device 600 may include multiple magnetic field sensing modules 200 connected through a single field line. Alternatively, the magnetic field sensing modules 200 may be connected through multiple field lines, such as multiple field lines in parallel. The field line(s) 612 shown in FIG. 6 may represent a single field line, or alternatively may represent multiple field lines in parallel. The average storage magnetization direction of each of the magnetic field sensing modules 200 is unique so that the average storage magnetization direction of each of the magnetic field sensing modules 200 is oriented differently relative to the external magnetic field 140 (see FIG. 1).

In the embodiment of FIG. 6, the magnetic field sensing modules 200 are spaced such that magnetic field sensing modules 200 having opposite average storage magnetization directions are disposed adjacent to (neighboring) each other. Alternatively, in another embodiment, magnetic field sensing modules 200 having opposite average storage magnetization directions may be disposed opposite to each other. The average storage magnetization directions of the magnetic field sensing modules 200 included in the magnetic field sensing device 600 are substantially equally spaced by an angle of about 360 degrees divided by 8 (the number of magnetic field sensing modules 200), or about 45 degrees. Specifically, in the embodiment of FIG. 6, the magnetic field sensing modules 200A-200H are located at angles of about 0°, about 45°, about 90°, about 135°, about 0°, about 45°, about 90°, and about 135°, respectively, relative to axis 602 extending from the magnetic field sensing module 200A. However, because current flows through the field line 612 in opposite directions for adjacent pairs of magnetic field sensing modules 200 (such as magnetic field sensing modules 200A and 200E), the average storage magnetizations of the magnetic field sensing modules 200B-200H rotate by about 45°, about 90°, about 135°, about 180°, about 225°, about 270°, and about 315°, respectively, relative to the average storage magnetization of the magnetic field sensing module 200A.

It is contemplated that more or fewer magnetic field sensing modules 200 than 8 may be included in the magnetic field sensing device 600. For example, if N magnetic field sensing modules 200 are included in the magnetic field sensing device 600, then the average storage magnetization directions of the N magnetic field sensing modules 200 can be substantially equally spaced by an angle of 360 degrees divided by N. It is also contemplated that in other embodiments, the magnetic field sensing modules 200 may be arranged in other ways. For example, the storage magnetization directions of the magnetic field sensing modules 200 may not be substantially equally spaced. Also, the magnetic field sensing modules 200 may be spaced such that magnetic field sensing modules 200 having opposite average storage magnetization directions are neither disposed adjacent to (neighboring) each other, nor substantially opposite to each other.

Figure 7:
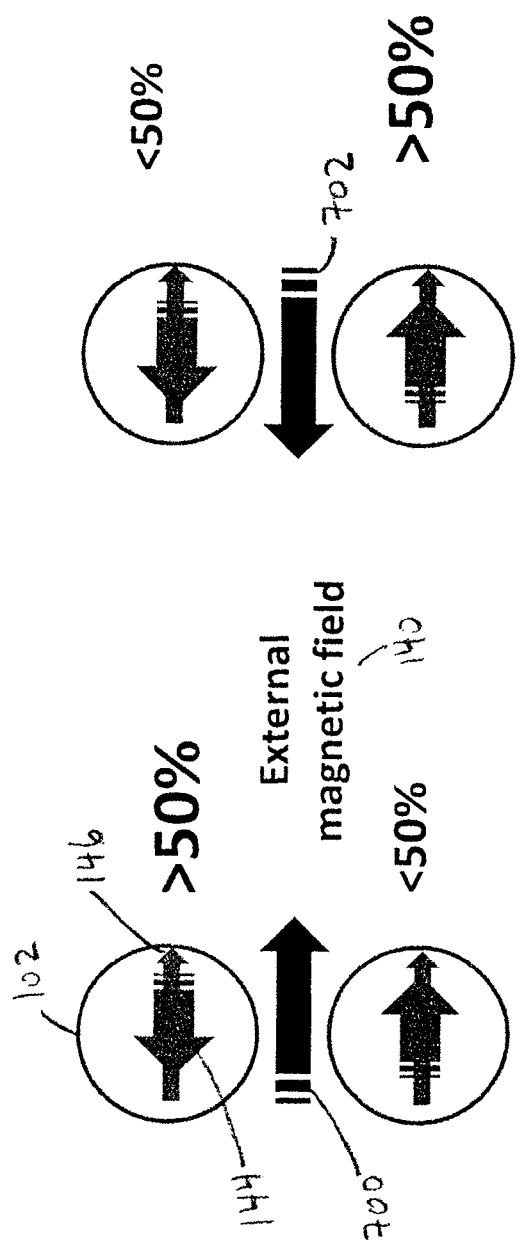
FIG. 7 illustrates storage magnetization directions and sense magnetization directions of magnetic field sensing elements in the presence of a first anti-parallel external magnetic field, according to an embodiment of the invention.
Figure 8:
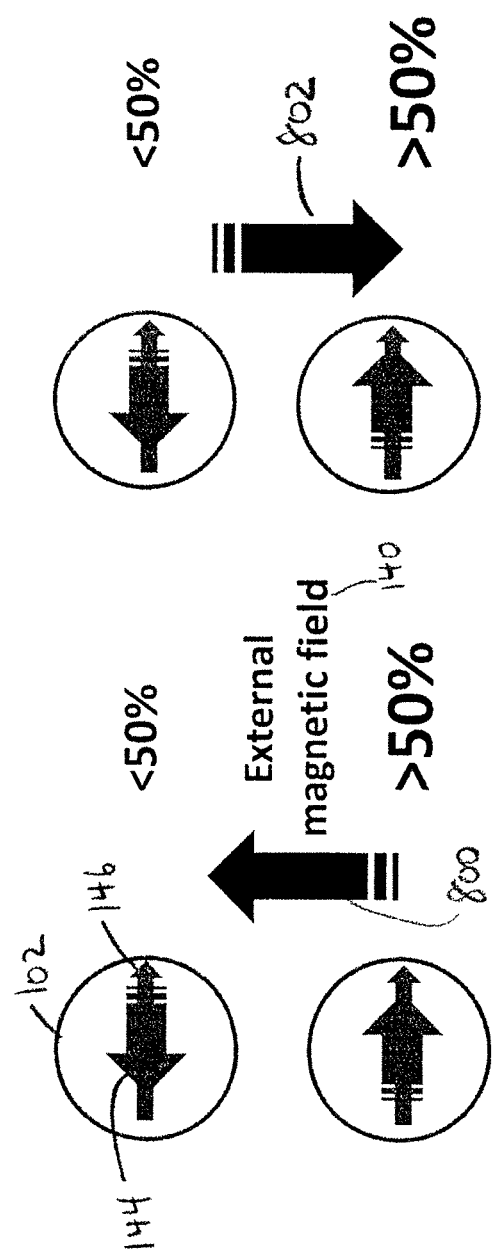
FIG. 8 illustrates storage magnetization directions and sense magnetization directions of magnetic field sensing elements in the presence of a second anti-parallel external magnetic field, according to an embodiment of the invention.

FIGS. 7 and 8 illustrate the storage magnetization directions 146 and the sense magnetization directions 144 of magnetic field sensing elements 102 in the presence of the external magnetic field 140, according to an embodiment of the invention. In FIG. 7, a direction 700 of the external magnetic field 140 is substantially aligned with the storage magnetization directions 146 of the magnetic field sensing elements 102 included in the magnetic field sensing module 200 (see FIG. 5). In this case, the magnetization of the storage layer 106 (see FIG. 1) is effectively increased, which increases the substantially anti-parallel coupling magnetization of the sense layer 104 (see FIG. 1). So in this case, the percentage of the magnetic field sensing elements 102 for which the storage magnetization direction 146 and the sense magnetization direction 144 are substantially anti-parallel is greater than 50% at the operating point 406 (see FIG. 4), and the percentage of the magnetic field sensing elements 102 for which the storage magnetization direction 146 and the sense magnetization direction 144 are substantially parallel is less than 50% at the operating point 406. This results in an increase in the output impedance of the magnetic field sensing module 200. In one embodiment, this results in an increase in the output signal 132, which can be a voltage measured across the magnetic field sensing module 200.

Conversely, for a direction 702 of the external magnetic field 140 that is substantially anti-aligned with the storage magnetization directions 146 of the magnetic field sensing elements 102 included in the magnetic field sensing module 200, the magnetization of the storage layer 106 (see FIG. 1) is effectively decreased. In this case, the percentage of the magnetic field sensing elements 102 for which the storage magnetization direction 146 and the sense magnetization direction 144 are substantially anti-parallel is less than 50% at the operating point 406 (see FIG. 4), and the percentage of the magnetic field sensing elements 102 for which the storage magnetization direction 146 and the sense magnetization direction 144 are substantially parallel is greater than 50% at the operating point 406. This results in a decrease in the output impedance of the magnetic field sensing module 200. In one embodiment, this results in a decrease in the output signal 132, which can be a voltage measured across the magnetic field sensing module 200.

Referring to FIGS. 5 and 6, pairs of magnetic field sensing modules 200 (200A and 200E; 200B and 200F; 200C and 200G; 200D and 200H) have substantially opposed storage magnetization directions 146 (see FIG. 1). To enhance detection of the external magnetic field 140, it is advantageous to detect a differential signal that is the difference between the output signals 132 of these pairs of magnetic field sensing modules 200. For example, as shown in the examples of FIG. 7, a magnitude of this differential signal may be increased relative to the output signals 132. This can be to enhance detection of the external magnetic field 140, and can be to suppress common mode noise (offset). Also as shown in the examples of FIG. 7, the magnitude of this differential signal may be maximized for the pair of magnetic field sensing modules 200 for which the direction of the external magnetic field 140 is substantially aligned with the storage magnetization directions 146 of the magnetic field sensing elements 102 included in one of the pair (and therefore substantially anti-aligned with the other of the pair). The sign of the differential signal is different for the two examples of FIG. 7.

In FIG. 8, for directions 800 and 802 of the external magnetic field 140 that are substantially perpendicular to the storage magnetization directions 146 of the magnetic field sensing elements 102 included in the magnetic field sensing module 200, the magnetization of the sense layer 104 (see FIG. 1) is slightly rotated. For both of the directions 800 and 802, the external magnetic field 140 may slightly decrease the additional magnetic field needed to switch the magnetization of the sense layer 104 from substantially anti-parallel to substantially parallel to the storage magnetization direction 146. In this case, the percentage of the magnetic field sensing elements 102 for which the storage magnetization direction 146 and the sense magnetization direction 144 are substantially anti-parallel may be less than 50% at the operating point 406 (see FIG. 4), and the percentage of the magnetic field sensing elements 102 for which the storage magnetization direction 146 and the sense magnetization direction 144 are substantially parallel may be greater than 50% at the operating point 406. This results in a decrease in the output impedance of the magnetic field sensing module 200. In one embodiment, this results in a decrease in the output signal 132, which can be a voltage measured across the magnetic field sensing module 200.

As shown in the examples of FIG. 8, the magnitude of a differential signal between a pair of magnetic field sensing modules 200 (see FIG. 5) for which the external magnetic field 140 is substantially perpendicular to the storage magnetization directions 146 (see FIG. 1) of the magnetic field sensing elements 102 included in the magnetic field sensing modules 200 may be approximately zero. This is because the effect of the Earth's magnetic field in the directions 800 and 802 on the output impedances of the pair of magnetic field sensing modules 200 may be substantially the same.

Referring to FIG. 5, the magnetic field sensing device 500 includes a magnetic field determination module 502 configured to determine a parameter of each of the magnetic field sensing modules 200 included in the magnetic field sensing device 500. This parameter varies based on impedances of the magnetic field sensing elements 102 included in each of the magnetic field sensing modules 200. In one embodiment, this parameter is an output impedance. In another embodiment, this parameter is a voltage and/or a current. It is contemplated that this parameter is not limited to these types, but instead may be of any type measured by the magnetic field determination module 502 that varies in a predictable manner based on the output impedance of the magnetic field sensing modules 200.

Referring to FIG. 5, we now present an example of output voltage measurements of each of the magnetic field sensing modules 200 included in the magnetic field sensing device 500 by the magnetic field determination module 502. The parameters used in this example are below:

Size of MTJ: 90 nm
TMR=100%
Rmin=4KΩ; Rav=6KΩ; Rmax=8KΩ
For each of 8 magnetic field sensing modules (MFSM) 200:
  Np=200; Ns=10; N=2,000; Rmin_mfsm=200Ω; Rav_mfsm=300Ω; Rmax_mfsm=400Ω (Rmin_mfsm, Rav_mfsm, and Rmax_mfsm are for 200 parallel rows of magnetic field sensing elements 102, with 10 magnetic field sensing elements 102 in series in each row)
  Input stage: Iin=25 mA (we assume 5 field lines in parallel per magnetic field sensing module 200, 5 mA per field line; each field line is across, and thereby magnetically connected to, two magnetic field sensing modules 200 in series)
  Input impedance: estimated around 25Ω; Vin=0.625V
  Output stage: Vcc=3V; Icc (DC bias current 210)=10 mA; Is (DC current per row of magnetic field sensing elements 102)=50 µA
  Coupling magnetic field=50 Oe; external magnetic field: 0.5 Oe or 1%
  ΔV for 1% effect: 20 mV Table 1 shows the output voltage measurements by the magnetic field determination module 502 for the 8 magnetic field sensing modules 200 in the above example. These output voltage measurements (ΔV) are the difference between the actual output voltage across each of the magnetic field sensing modules 200 and the bias voltage Vcc of the output stage (3 Volts in this example). Differential measurements of ΔV across pairs of magnetic field sensing modules (such as magnetic field sensing modules 1 and 5 in Table 1 below) have twice the magnitude of the measurements shown in Table 1. The magnetic field sensing module 1 (in Table 1 below) has a storage magnetization direction 146 (see FIG. 1) that is substantially aligned with the external magnetic field 140. The magnetic field sensing modules 2 through 8 (in Table 1 below) have storage magnetization directions 146 that are at x degrees relative to the external magnetic field 140, as shown in Table 1.

TABLE 1

Example of voltage measurements of 8 magnetic field sensing modules 200 by the magnetic field determination module 502

| | 1 | 2 | 3 | 4 | 5 | 6 | 7 | 8 |
| --- | --- | --- | --- | --- | --- | --- | --- | --- |
| Angle(x°) | 0 | 45 | 90 | 135 | 180 | 225 | 270 | 315 |
| ΔV (mV) | 20 | 14 | 0 | −14 | −20 | −14 | 0 | 14 |

In one embodiment, it is contemplated that a magnetic field sensing device 500 including the 8 magnetic field sensing modules 200 can be implemented in an integrated circuit having a die size of 0.125 square millimeters.

Referring to FIG. 5, the magnetic field sensing device 500 has input 130 and output 132. The input 130 may be a DC bias current and/or voltage for which the magnetic field sensing modules 200 are substantially at the operating point 406 (see FIG. 4). In one embodiment, the input 130 does not include an additional AC signal. Alternatively, the input 130 may include an additional AC or RF signal. A version of this additional AC signal would appear in measurements of the output 132 by the magnetic field determination module 502.

The magnetic field sensing device 500 also includes a control module 504. The control module 504 may measure the output impedance of each magnetic field sensing module 200 (or alternatively may measure the output 132 and obtain the output impedance based on the output 132). The control module 504 may adjust the input signal 130 such that the magnetic field sensing modules 200 are each set at an operating point at the midpoint 406 of the substantially linear region 410 of the I-V response curve (see FIG. 4). At the midpoint 406, the device sensitivity may be at its maximum. In one embodiment, the control module 504 also compensates for temperature variations and other effects that may cause the operating point to drift from the midpoint 406. The control module 504 may be implemented through a complementary metal oxide semiconductor (CMOS) process.

In one embodiment, the control module 504 may control a switch 508 (such as a transistor) that can turn the DC bias current 210 to the magnetic field sensing array 100 on or off. Power can be saved by turning on the DC bias current 210 only when needed for the magnetic field sensing device 500 to measure the direction of the external magnetic field 140 (see FIG. 2B). In the example of Table 1, for each of the magnetic field sensing modules 200, the power consumption is based on the following parameters:

Output: Vcc=3V Icc (DC bias current 210)=20 mA for 20 ns

Input: Vin=0.625V Iin (input signal 130)=25 mA for 20 ns

In the example of Table 1, the DC bias current 210 is applied for 20 nanoseconds, during which the magnetic field determination module 502 can perform measurements of the output 132. Similarly, the input signal 130 can be applied for 20 nanoseconds. The control module 504 may turn the input signal 130 on and off in a similar manner to that shown in FIG. 5 for the DC bias current 210.

In one embodiment, the magnetic field determination module 502 may determine the input impedance, voltage, and/or current of each magnetic field sensing module 200 (or alternatively may measure the input 130 and obtain the input impedance, voltage, and/or current based on the input 130). The magnetic field determination module 502 may extract minimum and maximum values of the input impedance, voltage, and/or current of each magnetic field sensing module 200.

From these measurements, the magnetic field determination module 502 can also determine the angular orientation of the magnetic field sensing device 500 relative to the external magnetic field 140 based on the parameter (such as the output impedance, output voltage, or output current) of each of the magnetic field sensing modules 200. The magnetic field determination module 502 may be configured to determine the angular orientation of the magnetic field sensing device 500 relative to the external magnetic field 140 in three dimensions based on Hall effect vertical axis sensing. In one embodiment, the magnetic field determination module 502 may estimate this angular orientation based on these measurements, such as through interpolation or other algorithms.

The magnetic field sensing device 500 can operate with magnetic field sensing elements 102 that are not linear due to hysteresis. In one embodiment, the control logic 504 increases the input 130 regularly (such as periodically) to measure the output impedance of each magnetic field sensing module 200 at the midpoint 506 (see FIG. 5). Since the measurements are occurring while the input 130 is increasing, hysteresis that results when the input 130 is decreasing does not affect the magnetic field sensing device 500. Alternatively, the control logic 504 can decrease the input 130 regularly to measure the output impedance of each magnetic field sensing module 200 at the midpoint 406 (see FIG. 4). In this embodiment, since the measurements are occurring while the input 130 is decreasing, hysteresis that results when the input 130 is increasing does not affect the magnetic field sensing device 500.

Figure 9:
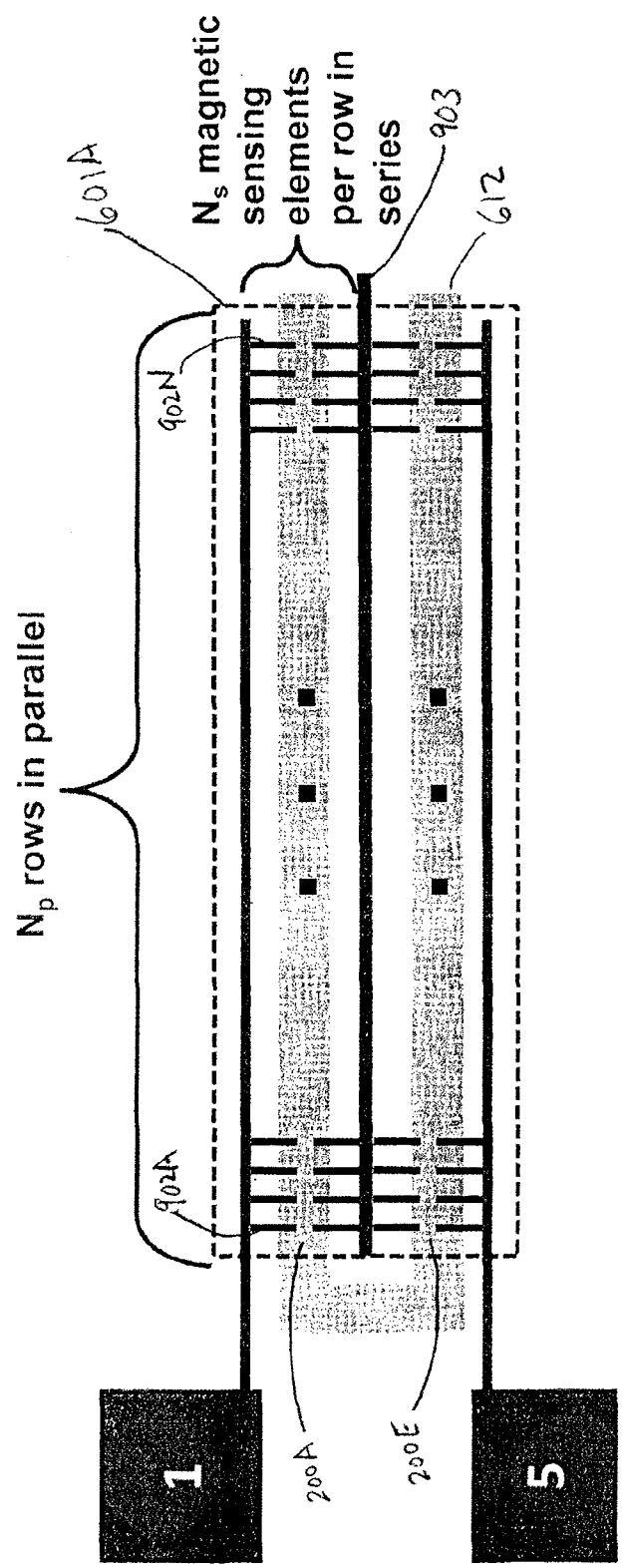
FIG. 9 illustrates a top view of a portion of the magnetic field sensing device of FIG. 6 including a top view of a pair of magnetic field sensing modules included in the portion of the magnetic field sensing device, according to an embodiment of the invention.

FIG. 9 illustrates a top view of the portion 601 of the magnetic field sensing device 600 of FIG. 6 including a top view of the pair of magnetic field sensing modules 200A and 200E included in the portion 601 of the magnetic field sensing device 600, according to an embodiment of the invention. FIG. 10 illustrates an expanded top view of the pair of magnetic field sensing modules 200A and 200E of FIG. 9, according to an embodiment of the invention. Each of the magnetic field sensing modules 200A-200H includes a corresponding magnetic field sensing array 100A-100H (see FIG. 6) that includes Np rows 902A-902N of magnetic field sensing elements 102 in parallel, and Ns magnetic sensing elements 102 per row 902 connected in series.

In one embodiment, the field line 612 may be a single field line. Alternatively, the field line 612 may represent multiple field lines 1012 in parallel. Each of the multiple field lines 1012 has an impedance that may include a resistive component (corresponding to impedance) and a reactive component (corresponding to an inductance and/or a capacitance). It may be advantageous to provide multiple field lines 1012 in parallel to reduce the input impedance of the magnetic field sensing module 200. Multiple field lines 1012 in parallel have a lower impedance, which can reduce the input power dissipation per magnetic field sensing element 102. Multiple field lines 1012 in parallel may also increase the effectiveness of cladding adjacent to the field lines 1012 (for focusing the magnetic field generated by the field lines 1012 so that magnetic coupling to the magnetic field sensing elements 102 is increased) as compared to a single wider field line 612 described with reference to FIG. 6. In one embodiment, each of the multiple field lines 1012 is magnetically connected to one of the magnetic field sensing elements 102 in each row 902. Alternatively, one or more of the multiple field lines 102 may be magnetically connected to multiple adjacent ones of the magnetic field sensing elements 102 in each row 902.

In one embodiment, each magnetic field sensing array 100 of magnetic sensing elements 102 included in the magnetic field sensing device 600 may be magnetically connected to the field line 612. The field line 612 may be curved and/or serpentine (shown in FIG. 6). In this embodiment, the input current 130 (see FIG. 2) flowing through the field line 612 flows in a first direction relative to the magnetic field sensing elements 102 included in the magnetic field sensing module 200A, and in a second direction substantially opposite to the first direction relative to the magnetic field sensing elements 102 included in the magnetic field sensing module 200E. In this embodiment, the same is true for the pairs of magnetic field sensing modules (200B, 200F), (200C, 200G), and (200D, 200H). As a result, a direction of the storage magnetization 146 of the magnetic field sensing elements 102 included in the magnetic field sensing module 200A resulting from the input current 130 is substantially opposite to a direction of the storage magnetization 146 of the magnetic field sensing elements 102 included in the magnetic field sensing module 200E resulting from the input current 130. In this way, the serpentine characteristic of the field line 612 and the field lines 1012 facilitates differential detection, as previously described with reference to FIG. 7.

In one embodiment, referring to FIG. 2B, the DC bias current 210 of the magnetic field sensing module 200A flows through the magnetic field sensing module 200A from a pad 1020 to a ground pad 903, and the DC bias current 210 of the magnetic field sensing module 200E flows through the magnetic field sensing module 200E from a pad 1022 to the ground pad 903. The differential voltage output across the magnetic field sensing modules 200A and 200E can be measured as the difference between the voltage at the pad 1020 and the voltage at the pad 1022.

There are a number of advantages of the magnetic field sensing array 100 as used in the embodiment of FIGS. 9 and 10. The DC bias current 210 (see FIG. 2B) is divided among the Np rows 902 connected in parallel, so Np can be configured such that the magnetic field sensing elements 102 avoid, for example, the breakdown voltage of MTJ's. A representative voltage threshold for MTJ's to avoid breakdown is approximately 0.5 Volts per MTJ, though this voltage threshold can vary based on, for example, different choices of materials, material concentrations, and/or material thicknesses. A corresponding current threshold for MTJ's having Rmin of 1 KΩ and Rmax of 2 KΩ is 250 μA. Given these voltage/current thresholds, the number Ns of magnetic field sensing elements 102 per row 902 connected in series can be configured so that the magnetic field sensing device 600 meets output voltage/current requirements. For example, for Ns=10, the output voltage and current per magnetic field sensing module 200 are 2.5 V to 5 V (for Rmin of 1 KΩ and Rmax of 2 KΩ, respectively) and 50 mA, respectively.

In addition, an increased number Np of rows 902 connected in parallel allows for increased robustness of the magnetic field sensing arrays 100 against failures of one or more magnetic field sensing elements 102 included in the magnetic field sensing arrays 100, as the larger the number Np of rows 902 in parallel for a given value of Ns, the less the effect (typically) on the overall impedance of the magnetic field sensing array 100 due to failure of the one or more magnetic field sensing elements 102. For example, if there are no MTJ failures, the impedance of the magnetic field sensing array 100 is Rmtj*Ns/Np. If there is a single MTJ failure that renders one of the rows 902 an open circuit, then the impedance of the magnetic field sensing array 100 becomes Rmtj*Ns/(Np−1). For Np=200, the difference between these impedance values is only approximately 0.5%.

Also, as previously described, the output power of the magnetic field sensing array 100 increases with the total number of magnetic field sensing elements 102 included in the magnetic field sensing array 100. The product Ns*Np can thereby be configured so that the magnetic field sensing device 600 meets output power requirements.

An example of the response curve relating an output signal of the magnetic field sensing modules 200 in the embodiment of FIGS. 9 and 10 to an input signal of the magnetic field sensing modules 200 in the embodiment FIGS. 9 and 10 is shown in FIG. 4, according to an embodiment of the invention.

Figure 11:
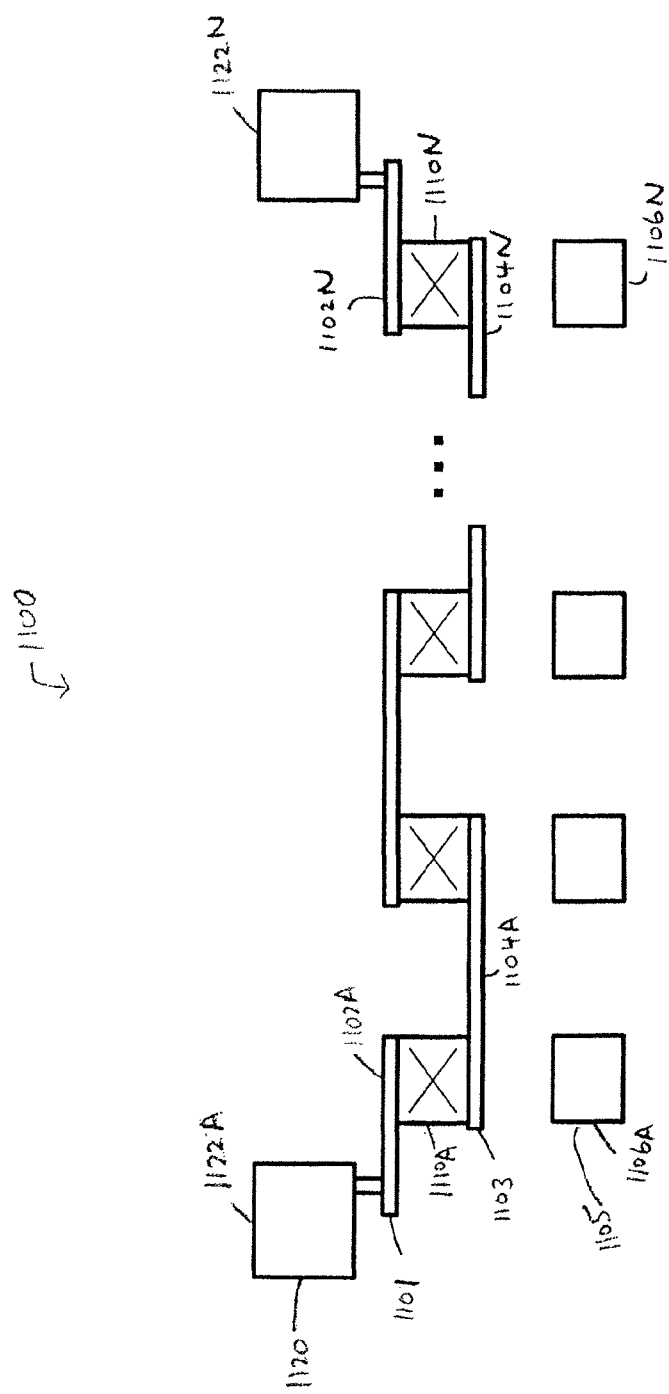
FIG. 11 illustrates a cross-sectional view of a portion of one of the pair of magnetic field sensing modules of FIG. 10, according to an embodiment of the invention.

FIG. 11 illustrates a perspective view of a portion 1100 of one of the pair of magnetic field sensing modules 200A and 200E of FIG. 10, according to an embodiment of the invention. In one embodiment, the portion 1100 includes, for a single row 902 included in one of the magnetic field sensing modules 200 of FIG. 10, the pads 1020 and 903, the magnetic field sensing elements 102, and the associated conductive layers electrically connected and magnetically connected to the magnetic field sensing elements 102. The portion 1100 includes magnetic field sensing elements 1110A-1110N (in one embodiment, corresponding to the magnetic field sensing elements 102 of FIG. 10, which can be MTJs), a first conductive layer 1101 including conductive interconnects 1102A-1102N that are each connected to a corresponding one or a pair of the magnetic field sensing elements 1110, a second conductive layer 1103 including straps 1104A-1104N that are each connected to a corresponding pair of the magnetic field sensing elements 1110, and a third conductive layer 1105 including field lines 1106A-1106N (in one embodiment, corresponding to the field lines 1012 of FIG. 10). Each of the field lines 1106 is magnetically coupled to a corresponding one of the magnetic field sensing elements 1110. In one embodiment, the portion 1100 includes a fourth conductive layer 1120 that includes sections 1122A-1122N (in one embodiment, corresponding to one or more of the pads 1020, 1030, and 903 of FIG. 10). The first conductive layer 1101 and the third conductive layer 1105 may be formed of Cu or other materials known to one of ordinary skill in the art. The second conductive layer 1103 may be formed of tantalum nitride (TaN) or other materials known to one of ordinary skill in the art. The fourth conductive layer 1120 may be formed of aluminum (Al) or other materials known to one of ordinary skill in the art. The fourth conductive layer is optional, as in certain applications (such as for integrated sensors) the magnetic field sensing modules 200 of FIG. 10 may be directly connected to other circuitry on a chip.

Figure 12:
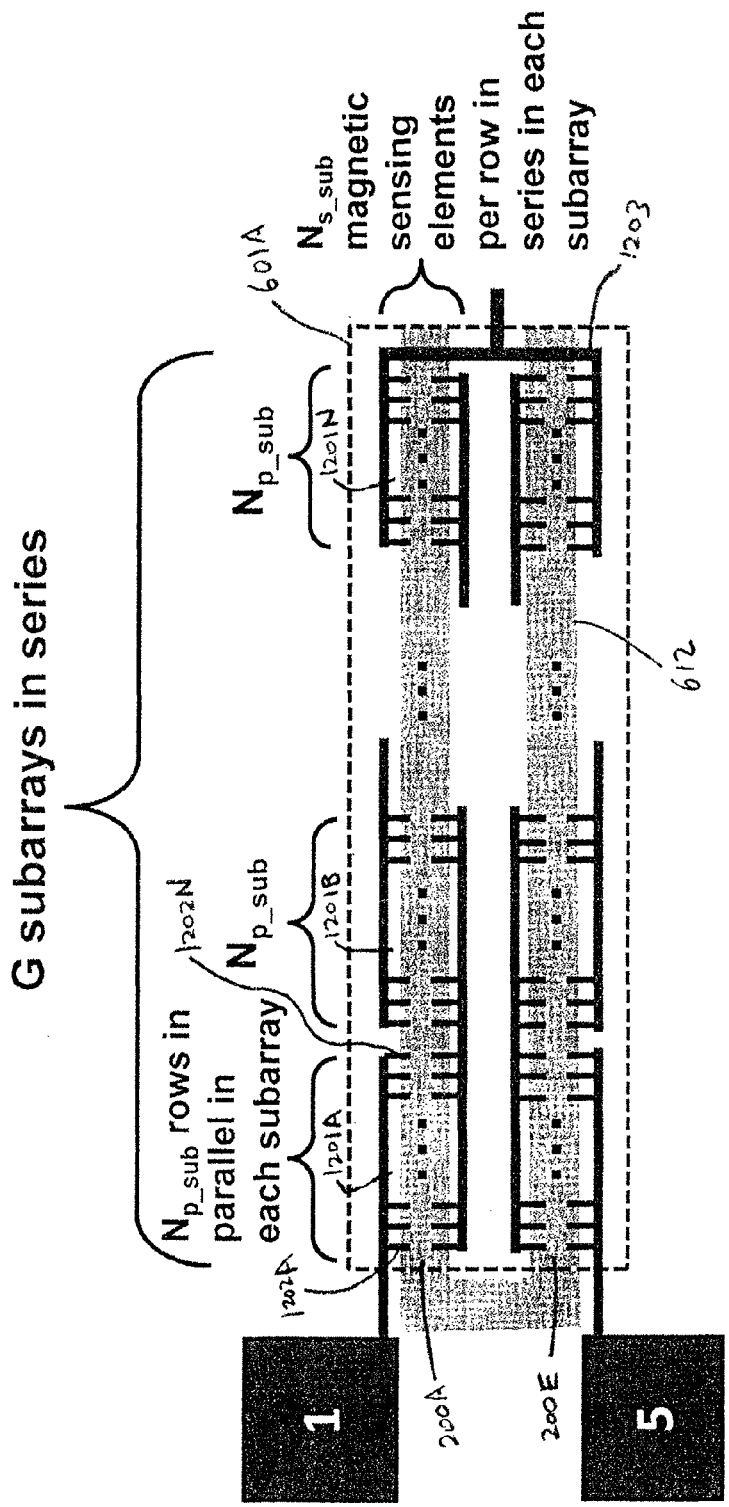
FIG. 12 illustrates a top view of a portion of the magnetic field sensing device of FIG. 6 including a top view of a pair of magnetic field sensing modules included in the portion of the magnetic field sensing device, according to an embodiment of the invention.
Figure 13:
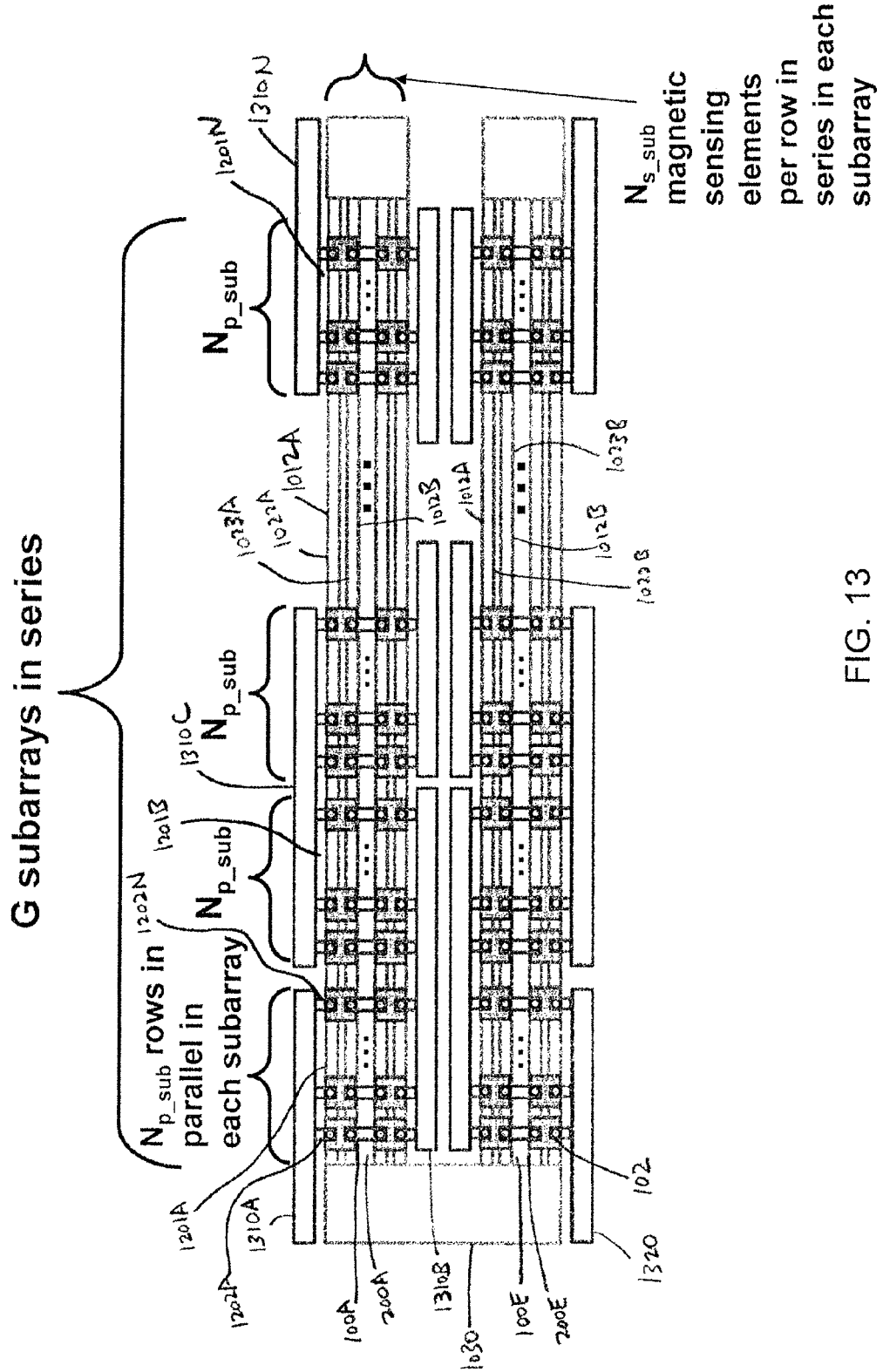
FIG. 13 illustrates an expanded top view of the pair of magnetic field sensing modules of FIG. 12, according to an embodiment of the invention.

FIG. 12 illustrates a top view of the portion 601 of the magnetic field sensing device 600 of FIG. 6 including a top view of the pair of magnetic field sensing modules 200A and 200E included in the portion 601 of the magnetic field sensing device 600, according to an embodiment of the invention. FIG. 13 illustrates an expanded top view of the pair of magnetic field sensing modules 200A and 200E of FIG. 12, according to an embodiment of the invention. Each of the magnetic field sensing modules 200A-200H includes a corresponding magnetic field sensing array 100A-100H (see FIG. 6) that includes G subarrays 1201A-1201N of magnetic field sensing elements 102. Each of the G subarrays 1201 includes Np_sub rows 1202A-1202N of magnetic field sensing elements 102 in parallel, and Ns_sub magnetic sensing elements 102 per row 1202 connected in series.

As previously described with reference to FIGS. 9 and 10, the field line 612 may be a single field line. Alternatively, the field line 612 may represent multiple field lines 1012 in parallel. Also as previously described with reference to FIGS. 9 and 10, the serpentine characteristic of the field line 612 and the field lines 1012 facilitates differential detection. In one embodiment, referring to FIG. 2B, the DC bias current 210 of the magnetic field sensing module 200A flows through the magnetic field sensing module 200A from a pad 1310A to a ground pad 1203, and the DC bias current 210 of the magnetic field sensing module 200E flows through the magnetic field sensing module 200E from a pad 1320 to the ground pad 1203. The differential voltage output across the magnetic field sensing modules 200A and 200E can be measured as the difference between the voltage at the pad 1310A and the voltage at the pad 1320.

There are a number of advantages of the magnetic field sensing array 100 (including subarrays 1201) as used in the embodiment of FIGS. 12 and 13 for higher voltage applications such as automotive applications (in one example, a 20 Volts to 40 Volts output voltage requirement, though the range of voltages for these applications is not restricted to this range). As output voltage requirements increase, Ns tends to increase and Np tends to decrease in the embodiment of FIGS. 9 and 10. This leads to an increase in the Ns field lines 1012 needed in the embodiment of FIGS. 9 and 10, which leads to an increase in the DC bias current 210 (see FIG. 2) needed, as the DC bias current 210 is divided between the Ns field lines 1012. One benefit of partitioning the magnetic field sensing array 100 into the G subarrays 1201 is that the number of field lines can be reduced by a factor of G. In the embodiment of FIGS. 12 and 13, the number G of subarrays 1201 can be configured such that Ns_sub (equal to Ns/G) is less than Np_sub (equal to Np). Through use of the subarrays 1201, the number of field lines 1012 can therefore be reduced from Ns (in the embodiment of FIGS. 9 and 10) to Ns_sub, which is Ns/G, resulting in significantly reduced output current and power requirements. For example, for Ns_sub=4, Np_sub=40, and G=20, the output voltage and current per magnetic field sensing module 200 are 20 V to 40 V (for Rmin of 1 KΩ and Rmax of 2 KΩ, respectively) and 10 mA, respectively.

In addition, as output voltage requirements increase, the increase in Ns and the decrease in Np in the embodiment of FIGS. 9 and 10 tends to reduce robustness of the magnetic field sensing arrays 100 against failures of one or more magnetic field sensing elements 102 included in the magnetic field sensing arrays 100. For example, in the embodiment of FIGS. 9 and 10, for Ns=80 and Np=40, if there are no MTJ failures, the impedance of the magnetic field sensing array 100 is Rmtj*Ns/Np=Rmtj*2. If there is a single MTJ failure that renders one of the rows 902 an open circuit, then the impedance of the magnetic field sensing array 100 becomes Rmtj*Ns/(Np−1)=Rmtj*80/39. The difference between these impedance values is approximately 2.5%. The partitioning of the magnetic field sensing array 100 into the G subarrays 1201 is a way to further increase the robustness of the magnetic field sensing arrays 100 against failures of one or more magnetic field sensing elements 102 included in the magnetic field sensing arrays 100, even for output voltage requirements in, for example, the 20 V to 40 V range. If there are no MTJ failures, the impedance of the magnetic field sensing array 100 is Rmtj*G*Ns_sub/Np_sub=Rmtj*2. If there is a single MTJ failure that renders one of the rows 1202 an open circuit, then the impedance of the magnetic field sensing array 100 becomes Rmtj*((G−1)*Ns_sub/Np_sub+Ns_sub/(Np_sub−1))=Rmtj*2.0026. The difference between these impedance values is approximately 0.13%, approximately a factor of 20 lower than in the embodiment of FIGS. 9 and 10 for this higher voltage application.

Also, as previously described, the output power of the magnetic field sensing array 100 increases with the total number of magnetic field sensing elements 102 included in the magnetic field sensing array 100. The product G*Ns_sub*Np_sub can thereby be configured so that the magnetic field sensing device 600 meets output power requirements.

Figure 14:
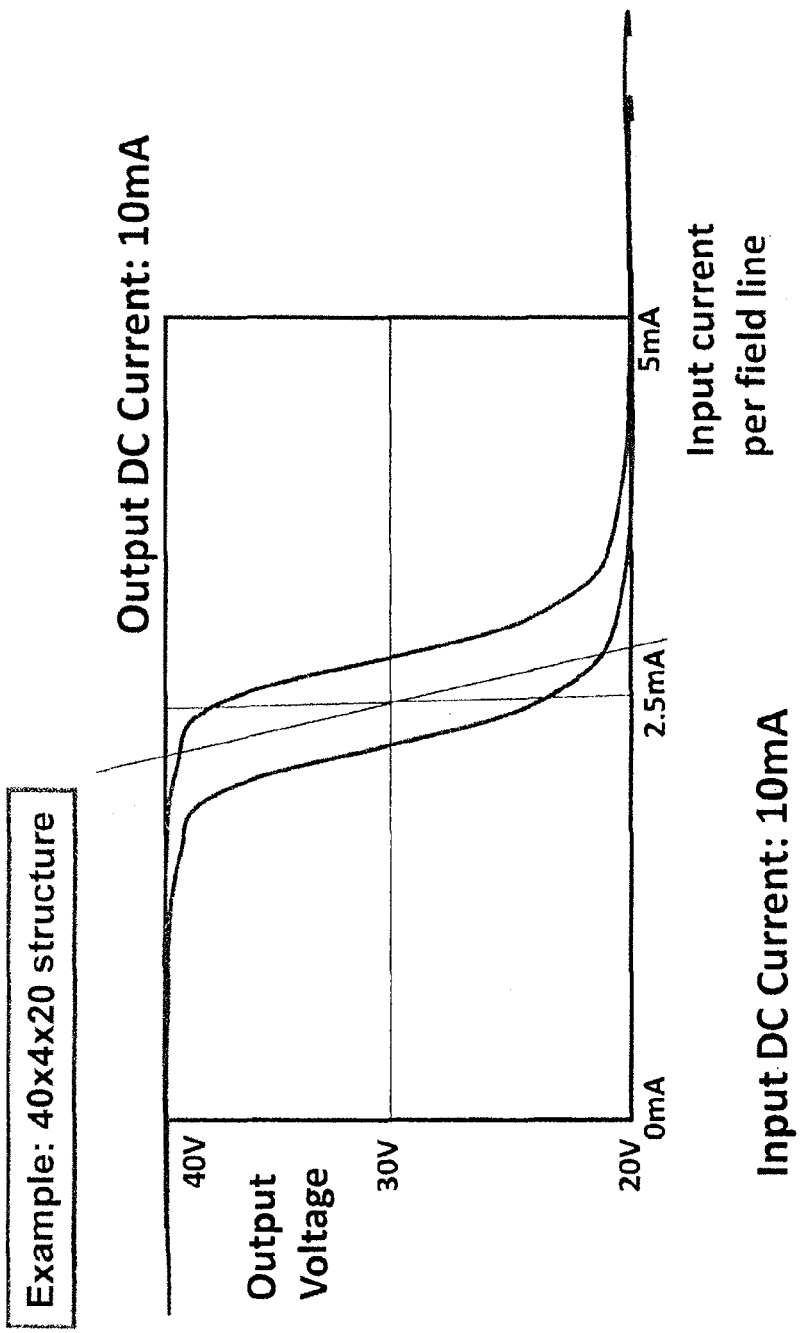
FIG. 14 illustrates an example of a response curve relating an output signal of the magnetic field sensing module in the embodiment of FIGS. 12 and 13 to an input signal to the magnetic field sensing module in the embodiment of FIGS. 12 and 13, according to an embodiment of the invention.

FIG. 14 illustrates an example of a response curve relating an output signal of the magnetic field sensing modules 200 in the embodiment of FIGS. 12 and 13 to an input signal to the magnetic field sensing modules 200 in the embodiment of FIGS. 12 and 13, according to an embodiment of the invention. The description of FIG. 14 is in many respects similar to FIG. 4, so only portions that are different are stated here. FIG. 14 is for the structure of the magnetic field sensing modules 200 in the embodiment of FIGS. 12 and 13, which has Ns_sub=4, Np_sub=40, and G=20. In this example, the input DC current 130 (see FIG. 2B) is 10 mA (divided among 4 field lines 1012, as shown in FIG. 13), and the output DC current 132 is 10 mA, as previously described with reference to FIGS. 12 and 13. In this example, the output voltage is in the range from 20 V to 40 V, as previously described with reference to FIGS. 12 and 13.

FIG. 11 also illustrates a perspective view of a portion 1100 of one of the pair of magnetic field sensing modules 200A and 200E of FIG. 13, according to an embodiment of the invention. In one embodiment, the portion 1100 includes, for a single row 1202 included in one of the magnetic field sensing modules 200 of FIG. 13, the pads (sections) 1310A and 1310B, the magnetic field sensing elements 102, and the associated conductive layers electrically connected and magnetically connected to the magnetic field sensing elements 102. The portion 1100 includes magnetic field sensing elements 1110A-1110N (in one embodiment, corresponding to the magnetic field sensing elements 102 of FIG. 13, which can be MTJs), a first conductive layer 1101 including conductive interconnects 1102A-1102N that are each connected to a corresponding one or a pair of the magnetic field sensing elements 1110, a second conductive layer 1103 including straps 1104A-1104N that are each connected to a corresponding pair of the magnetic field sensing elements 1110, and a third conductive layer 1105 including field lines 1106A-1106N (in one embodiment, corresponding to the field lines 1012 of FIG. 13). Each of the field lines 1106 is magnetically coupled to a corresponding one of the magnetic field sensing elements 1110. In one embodiment, the portion 1100 includes a fourth conductive layer 1120 that may include sections 1310A-1310N (in one embodiment, including the pads 1310A and 1310B of FIG. 13 to which the subarray 1201A is connected, the pads 1310B and 1310C of FIG. 13 to which the subarray 1201B is connected, etc.). The fourth conductive layer 1120 may include pad 1030 of FIG. 13. The first conductive layer 1101 and the third conductive layer 1105 may be formed of Cu or other materials known to one of ordinary skill in the art. The second conductive layer 1103 may be formed of tantalum nitride (TaN) or other materials known to one of ordinary skill in the art. The fourth conductive layer 1120 may be formed of aluminum (Al) or other materials known to one of ordinary skill in the art. The fourth conductive layer is optional, as in certain applications (such as for integrated sensors) the magnetic field sensing modules 200 of FIG. 13 may be directly connected to other circuitry on a chip.

Figure 15:
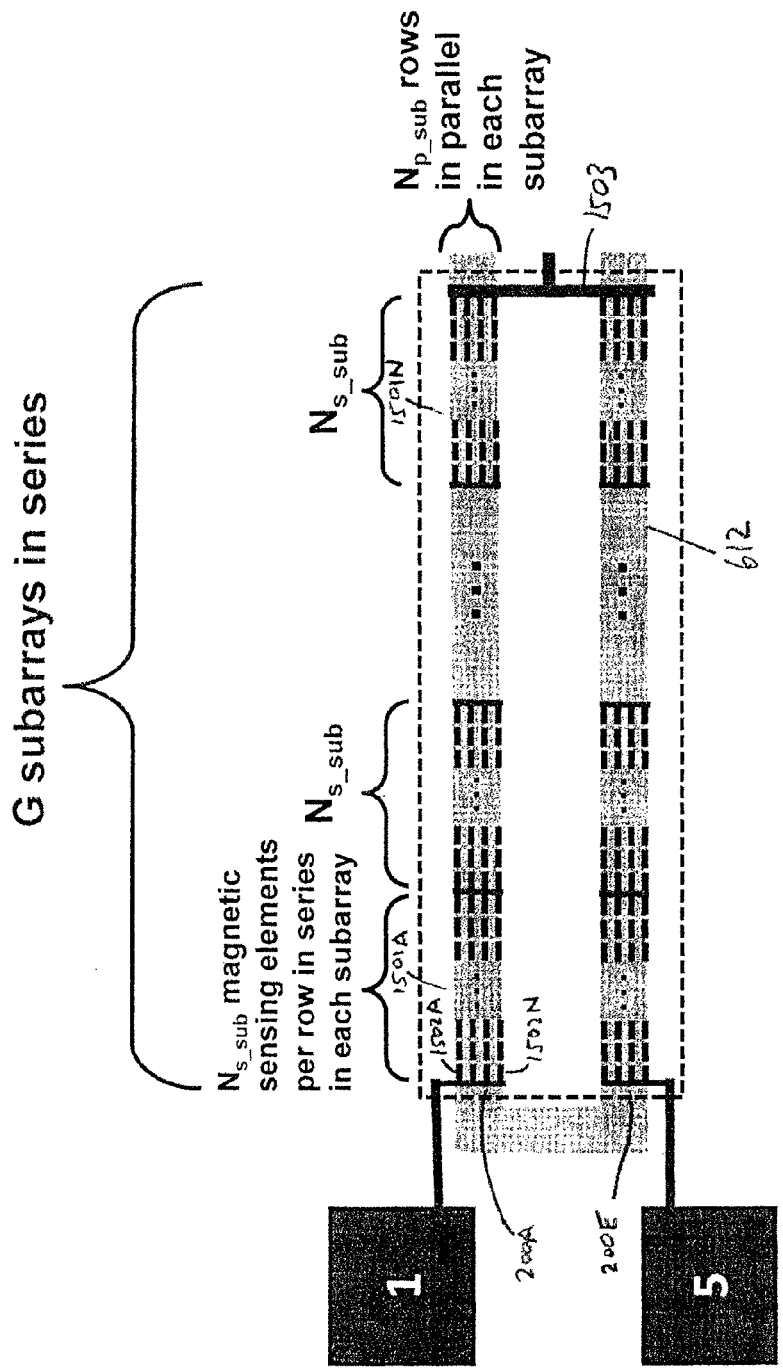
FIG. 15 illustrates a top view of a portion of the magnetic field sensing device of FIG. 6 including a top view of a pair of magnetic field sensing modules included in the portion of the magnetic field sensing device, according to an embodiment of the invention.
Figure 16:
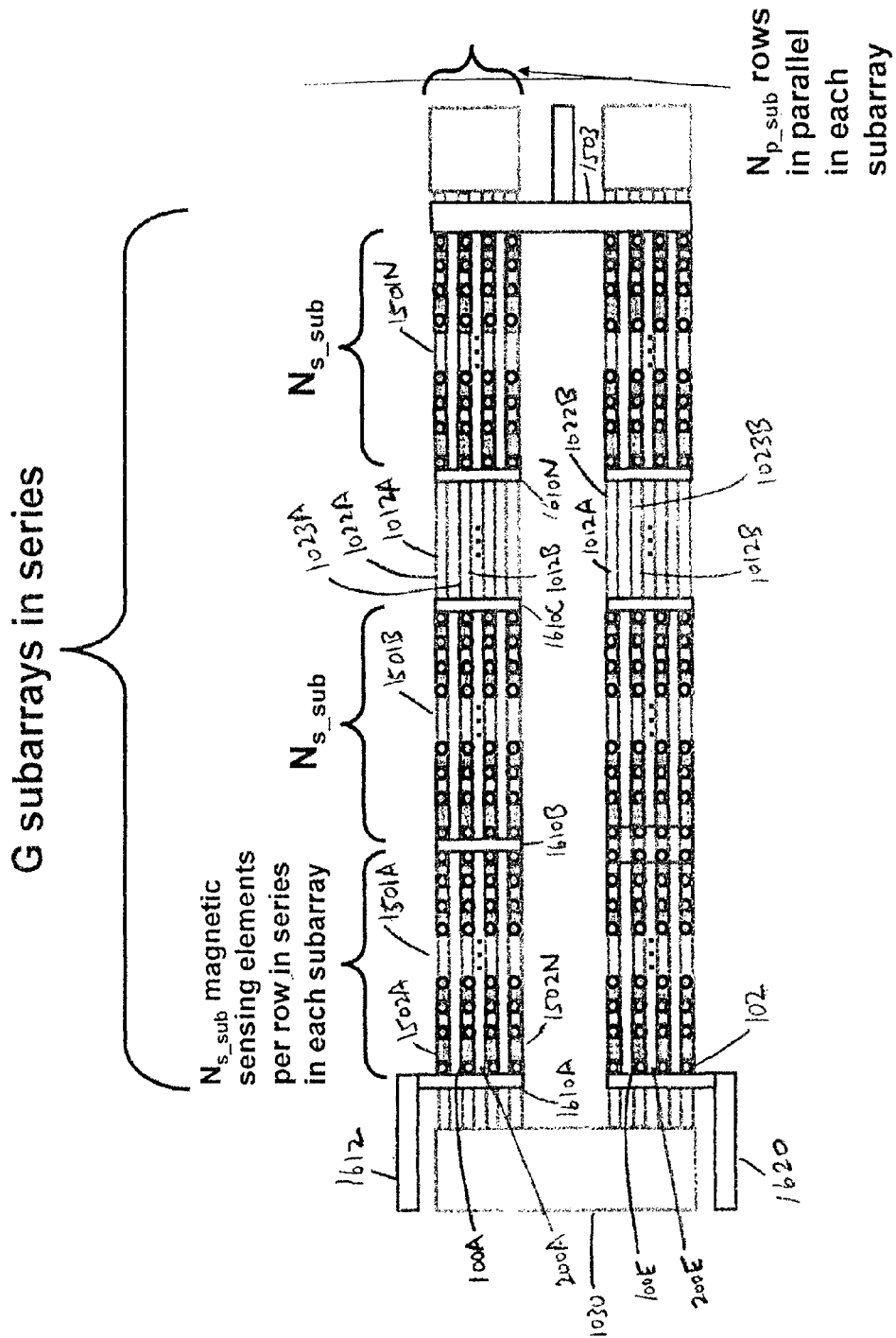
FIG. 16 illustrates an expanded top view of the pair of magnetic field sensing modules of FIG. 15, according to an embodiment of the invention.

FIG. 15 illustrates a top view of the portion 601 of the magnetic field sensing device 600 of FIG. 6 including a top view of the pair of magnetic field sensing modules 200A and 200E included in the portion 601 of the magnetic field sensing device 600, according to an embodiment of the invention. FIG. 16 illustrates an expanded top view of the pair of magnetic field sensing modules 200A and 200E of FIG. 15, according to an embodiment of the invention. Each of the magnetic field sensing modules 200A-200H includes a corresponding magnetic field sensing array 100A-100H (see FIG. 6) that includes G subarrays 1501A-1501N of magnetic field sensing elements 102. Each of the G subarrays 1501 includes Np_sub rows 1502A-1502N of magnetic field sensing elements 102 in parallel, and Ns_sub magnetic sensing elements 102 per row 1202 connected in series.

As previously described with reference to FIGS. 9 and 10, the field line 612 may be a single field line. Alternatively, the field line 612 may represent multiple field lines 1012 in parallel. Also as previously described with reference to FIGS. 9 and 10, the serpentine characteristic of the field line 612 and the field lines 1012 facilitates differential detection. In one embodiment, referring to FIG. 2B, the DC bias current 210 of the magnetic field sensing module 200A flows through the magnetic field sensing module 200A from a pad 1612 to a ground pad 1503, and the DC bias current 210 of the magnetic field sensing module 200E flows through the magnetic field sensing module 200E from a pad 1620 to the ground pad 1503. The differential voltage output across the magnetic field sensing modules 200A and 200E can be measured as the difference between the voltage at the pad 1612 and the voltage at the pad 1620.

There are a number of advantages of the magnetic field sensing array 100 (including subarrays 1501) as used in the embodiment of FIGS. 15 and 16 for high voltage applications (in one example, a 50 Volts to 100 Volts output voltage requirement, though the range of voltages for these applications is not restricted to this range). As output voltage requirements increase, Ns_sub tends to increase and Np_sub tends to decrease in the embodiment of FIGS. 12 and 13. This leads to an increase in the Ns_sub field lines 1012 needed in the embodiment of FIGS. 12 and 13, which leads to an increase in the DC bias current 210 (see FIG. 2) needed, as the DC bias current 210 is divided between the Ns_sub field lines 1012. One approach to reduce the number of field lines 1012 is to orient the subarrays 1501 such that the current flow through each of the rows 1502 is in substantially parallel to the current flow through a portion of the field lines 1012, such as but not limited to the portion of the field lines 1012 nearest to each of the rows 1502. In this way, the number of field lines 1012 can therefore be reduced from Ns_sub (in the embodiment of FIGS. 12 and 13) to Np_sub, resulting in significantly reduced output current and power requirements. For example, for Ns_sub=10, Np_sub=4, and G=20, the output voltage and current per magnetic field sensing module 200 are 50 V to 100 V (for Rmin of 1 KΩ and Rmax of 2 KΩ, respectively) and 2 mA, respectively.

In addition, due to the partitioning of the magnetic field sensing modules 200 into the subarrays 1501, the robustness of the magnetic field sensing arrays 100 against failures of one or more magnetic field sensing elements 102 included in the magnetic field sensing arrays 100 is increased relative to the embodiment of FIGS. 9 and 10, in a similar manner to that previously described for the embodiment of FIGS. 12 and 13.

Also, as previously described, the output power of the magnetic field sensing array 100 increases with the total number of magnetic field sensing elements 102 included in the magnetic field sensing array 100. The product G*Ns_sub*Np_sub can thereby be configured so that the magnetic field sensing device 600 meets output power requirements.

Figure 17:
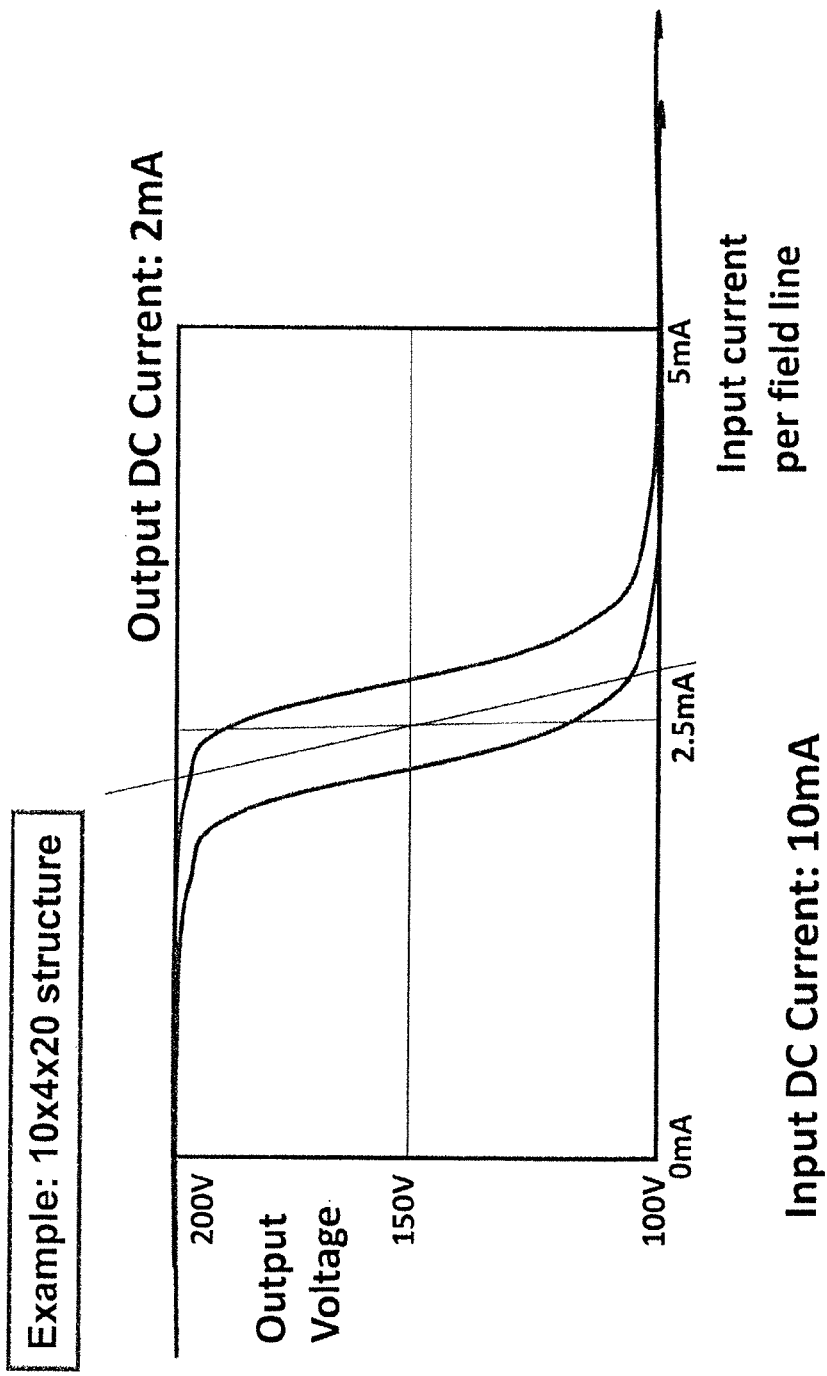
FIG. 17 illustrates an example of a response curve relating an output signal of the magnetic field sensing module in the embodiment of FIGS. 15 and 16 to an input signal to the magnetic field sensing module in the embodiment of FIGS. 15 and 16, according to an embodiment of the invention.

FIG. 17 illustrates an example of a response curve relating an output signal of the magnetic field sensing modules 200 in the embodiment of FIGS. 15 and 16 to an input signal to the magnetic field sensing modules 200 in the embodiment of FIGS. 15 and 16, according to an embodiment of the invention. The description of FIG. 17 is in many respects similar to FIG. 4, so only portions that are different are stated here. FIG. 17 is for the structure of the magnetic field sensing modules 200 in the embodiment of FIGS. 15 and 16, which has Ns_sub=10, Np_sub=4, and G=20. In this example, the input DC current 130 (see FIG. 2B) is 10 mA (divided among 4 field lines 1012, as shown in FIG. 16), and the output DC current 132 is 2 mA, as previously described with reference to FIGS. 15 and 16. In this example, the output voltage is in the range from 50 V to 100 V, as previously described with reference to FIGS. 15 and 16.

Figure 18:
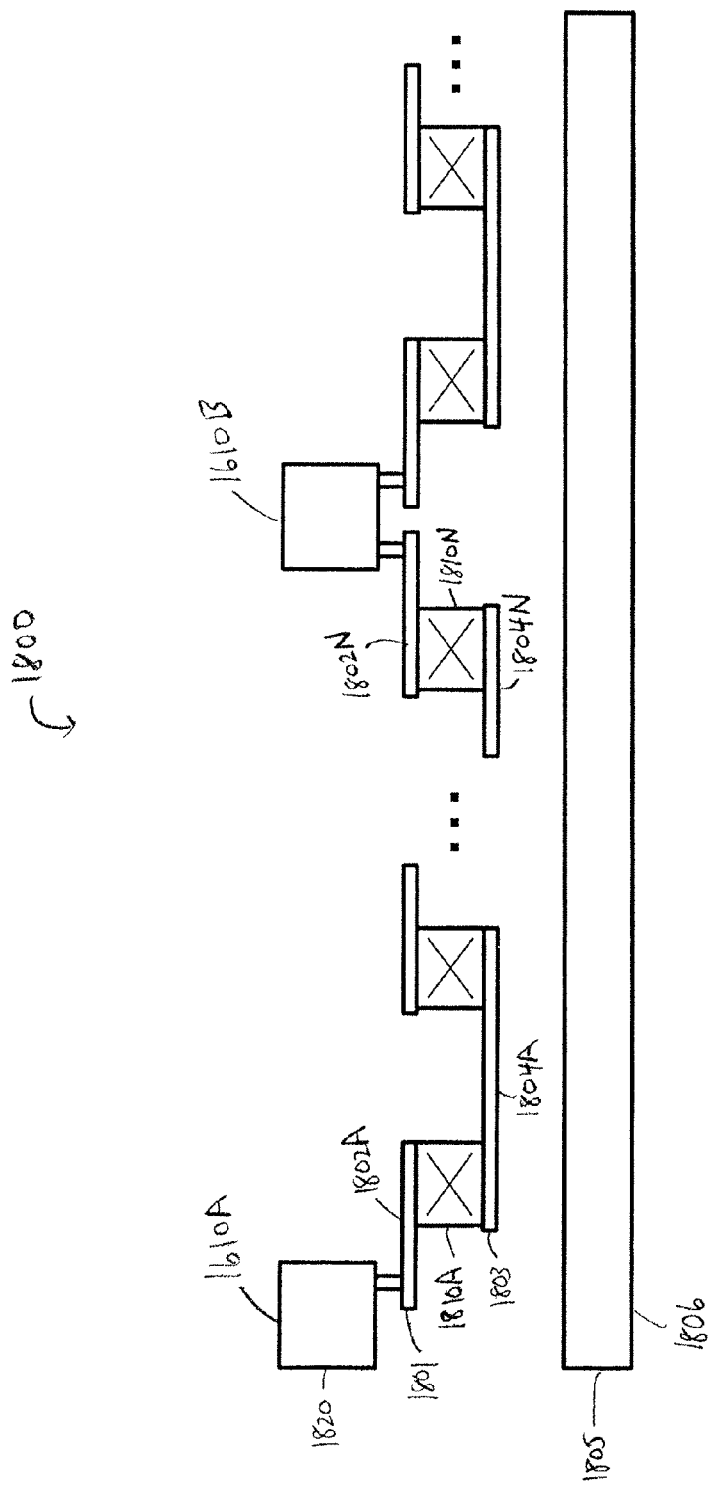
FIG. 18 illustrates a cross-sectional view of a portion of one of the pair of magnetic field sensing modules of FIG. 16, according to an embodiment of the invention.

FIG. 18 also illustrates a perspective view of a portion 1800 of one of the pair of magnetic field sensing modules 200A and 200E of FIG. 16, according to an embodiment of the invention. In one embodiment, the portion 1800 includes, for a single row 1502 included in one of the magnetic field sensing modules 200 of FIG. 16, the pads (sections) 1610A and 1610B, the magnetic field sensing elements 102, and the associated conductive layers electrically connected and magnetically connected to the magnetic field sensing elements 102. The portion 1800 includes magnetic field sensing elements 1810A-1810N (in one embodiment, corresponding to the magnetic field sensing elements 102 of FIG. 16, which can be MTJs), a first conductive layer 1801 including conductive interconnects 1802A-1802N that are each connected to a corresponding one or a pair of the magnetic field sensing elements 1810, a second conductive layer 1803 including straps 1804A-1804N that are each connected to a corresponding pair of the magnetic field sensing elements 1810, and a third conductive layer 1805 including field line 1806 (in one embodiment, corresponding to one of the field lines 1012 of FIG. 16). The field line 1806 is magnetically coupled to each of the magnetic field sensing elements 1810 included in the portion 1800. In one embodiment, the portion 1800 includes a fourth conductive layer 1820 that may include sections 1610A-1610N (in one embodiment, including the pads 1610A and 1610B of FIG. 16 to which the subarray 1501A is connected, the pads 1610B and 1610C of FIG. 16 to which the subarray 1501B is connected, etc.). The fourth conductive layer 1820 may include pad 1030 of FIG. 16. The first conductive layer 1801 and the third conductive layer 1805 may be formed of Cu or other materials known to one of ordinary skill in the art. The second conductive layer 1803 may be formed of tantalum nitride (TaN) or other materials known to one of ordinary skill in the art. The fourth conductive layer 1820 may be formed of aluminum (Al) or other materials known to one of ordinary skill in the art. The fourth conductive layer is optional, as in certain applications (such as for integrated sensors) the magnetic field sensing modules 200 of FIG. 16 may be directly connected to other circuitry on a chip.

Referring to FIGS. 1-18 and 20-21, in one embodiment, an apparatus comprises a plurality of circuits, each of the plurality of circuits including an array of magnetic tunnel junctions (such as the magnetic field sensing array 100 including the magnetic field sensing elements 102) partitioned into a plurality of subarrays (such as the subarrays 1201 of FIGS. 12 and 13 or the subarrays 1501 of FIGS. 15 and 16), wherein: the magnetic tunnel junctions in each of the plurality of subarrays are arranged in a plurality of rows (such as the rows 1202 of FIGS. 12 and 13 or the rows 1502 of FIGS. 15 and 16), the magnetic tunnel junctions in each of the plurality of rows are connected in series, and the plurality of rows are connected in parallel; the plurality of subarrays are connected in series; and each magnetic tunnel junction includes a storage layer having a storage magnetization and a sense layer having a sense magnetization, each magnetic tunnel junction being configured such that the sense magnetization and impedance of each magnetic tunnel junction vary in response to an external magnetic field (such as the external magnetic field 140). The apparatus further comprises a module (such as the magnetic field determination module 502 of FIG. 5) configured to determine the external magnetic field based on a parameter of each of the plurality of circuits, wherein the parameter of each of the plurality of circuits varies based on a combined impedance of the multiple magnetic tunnel junctions, the module being implemented in at least one of a memory or a processing device.

In one embodiment of the apparatus, the magnetic tunnel junctions in one or more of the plurality of rows are disposed between a first conductive layer (such as the first conductive layer 1101 of FIG. 11 or the first conductive layer 1801 of FIG. 18) and a second conductive layer (such as the second conductive layer 1103 of FIG. 11 or the second conductive layer 1803 of FIG. 18) including a strap; a first magnetic tunnel junction, a second magnetic tunnel junction, and a third magnetic tunnel junction disposed between the first magnetic tunnel junction and the second magnetic tunnel junction are included in the magnetic tunnel junctions (such as the MTJs 1110 of FIG. 11 or the MTJs 1810 of FIG. 18) in the one or more of the plurality of rows; the first magnetic tunnel junction and the third magnetic tunnel junction are connected to a portion of the first conductive layer; and the second magnetic tunnel junction and the third magnetic tunnel junction are connected to the strap. The strap may be formed of a different material than the first conductive layer, and the strap may be thinner than the first conductive layer.

In one embodiment of the apparatus, the apparatus further comprises a first conductive layer including a first section (such as the section 1310A of FIG. 13 or the section 1610A of FIG. 16), a second section physically separated from the first section, and a third section physically separated from the first section and the second section, wherein: the plurality of subarrays include a first subarray and a second subarray adjacent to the first subarray; the first subarray is disposed between the first section and the third section; and the second subarray is disposed between the second section and the third section. The third section may be disposed between the first subarray and the second subarray. The third section may be displaced from each of the first section and the second section in a first direction, and the third section may be substantially parallel to the first section and the second section. The first section may be displaced from the second section in a second direction substantially perpendicular to the first direction.

In one embodiment, the apparatus further comprises a field line (such as the field line 612 or the field lines 1012 of FIGS. 12, 13, 15, and 16) configured for a first current flow to traverse the field line and having a plurality of portions including a first portion (such as portion 622A of the field line 612 of FIG. 6) and a second portion (such as portion 622B of the field line 612 of FIG. 6), wherein: the plurality of circuits include a first circuit and a second circuit; the field line is configured to generate a first magnetic field for configuring an operating point of the first circuit based on the first current flow through the first portion of the field line; and a direction of the first current flow through the first portion of the field line is substantially perpendicular to the first direction (such as in the embodiment of FIGS. 12 and 13). The direction of the first current flow through the first portion of the field line may be substantially perpendicular to a direction of a second current flow through one or more of the plurality of rows of the first subarray (such as row 1202A of subarray 1201A of FIG. 13), and to a direction of a third current flow through one or more of the plurality of rows of the second subarray (such as subarray 1201B of FIG. 13). The direction of the second current flow through the one or more of the plurality of rows of the first subarray may be substantially opposite to the direction of the third current flow through the one or more of the plurality of rows of the second subarray.

In one embodiment of the apparatus, the field line is configured to generate a second magnetic field for configuring an operating point of the second circuit based on the first current flow through the second portion of the field line; and a direction of the first current flow through the second portion of the field line is substantially opposite to the direction of the first current flow through the first portion of the field line. The apparatus may be configured to generate a differential signal, the differential signal being a difference between a first output signal of the first circuit (such as the magnetic field sensing module 200A of FIGS. 12 and 13) and a second output signal of the second circuit (such as the magnetic field sensing module 200E of FIGS. 12 and 13), wherein a magnitude of the differential signal is increased relative to the first output signal and the second output signal. The apparatus may be configured to generate the differential signal for suppression of common mode noise.

In one embodiment, the apparatus further comprises a second conductive layer and a third conductive layer, wherein: the magnetic tunnel junctions in one or more of the plurality of rows included in the first subarray are disposed between the second conductive layer (such as the conductive layer 1101 of FIG. 11) and the third conductive layer (such as the conductive layer 1103 of FIG. 11); a current flow through the magnetic tunnel junctions in the one or more of the plurality of rows included in the first subarray traverses the second conductive layer and the third conductive layer; and the second conductive layer and the third conductive layer are oriented in a second direction substantially the same as the first direction.

In one embodiment of the apparatus, the third section is displaced from the first section in a first direction; the third section is displaced from the second section in a second direction substantially opposite to the first direction; and the third section is substantially parallel to the first section and the second section. The second section may be displaced from the first section in a third direction substantially the same as the first direction.

In one embodiment, the apparatus further comprises a field line (such as the field line 612 or the field lines 1012 of FIGS. 12, 13, 15, and 16) configured for a first current flow to traverse the field line and having a plurality of portions including a first portion (such as portion 622A of the field line 612 of FIG. 6) and a second portion (such as portion 622B of the field line 612 of FIG. 6), wherein: the plurality of circuits include a first circuit and a second circuit; the field line is configured to generate a first magnetic field for configuring an operating point of the first circuit based on the first current flow through the first portion of the field line; and a direction of the first current flow through the first portion of the field line is substantially parallel to the first direction (such as in the embodiment of FIGS. 15 and 16). The direction of the first current flow through the first portion of the field line may be substantially parallel to a direction of a second current flow through one or more of the plurality of rows of the first subarray (such as row 1502A of subarray 1501A of FIG. 16), and to a direction of a third current flow through one or more of the plurality of rows of the second subarray (such as subarray 1501B of FIG. 16). The direction of the second current flow through the one or more of the plurality of rows of the first subarray (such as subarray 1501A of FIG. 16) may be substantially the same as the direction of the third current flow through the one or more of the plurality of rows of the second subarray (such as subarray 1501B of FIG. 16).

In one embodiment of the apparatus, the field line is configured to generate a second magnetic field for configuring an operating point of the second circuit based on the first current flow through the second portion of the field line; and a direction of the first current flow through the second portion of the field line is substantially opposite to the direction of the first current flow through the first portion of the field line. The apparatus may be configured to generate a differential signal, the differential signal being a difference between a first output signal of the first circuit (such as the magnetic field sensing module 200A of FIGS. 15 and 16) and a second output signal of the second circuit (such as the magnetic field sensing module 200E of FIGS. 15 and 16), wherein a magnitude of the differential signal is increased relative to the first output signal and the second output signal. The apparatus may be configured to generate the differential signal for suppression of common mode noise.

In one embodiment, the apparatus further comprises a second conductive layer and a third conductive layer, wherein: the magnetic tunnel junctions in one or more of the plurality of rows included in the first subarray are disposed between the second conductive layer (such as the conductive layer 1801 of FIG. 18) and the third conductive layer (such as the conductive layer 1803 of FIG. 18); a current flow through the magnetic tunnel junctions in the one or more of the plurality of rows included in the first subarray traverses the second conductive layer and the third conductive layer;

and the second conductive layer and the third conductive layer are oriented in a second direction substantially the same as the first direction.

In one embodiment, an apparatus comprises a plurality of circuits including a first circuit and a second circuit, each of the plurality of circuits including a plurality of subarrays (such as the subarrays 1201 of FIGS. 12 and 13) of magnetic tunnel junctions, wherein: the magnetic tunnel junctions in each of the plurality of subarrays are arranged in a plurality of rows (such as the rows 1202 of FIGS. 12 and 13), the magnetic tunnel junctions in each of the plurality of rows are connected in series, and the plurality of rows are connected in parallel; and the plurality of subarrays are connected in series. The apparatus further comprises a field line (such as the field line 612 or the field lines 1012 of FIGS. 12 and 13) configured to generate a first magnetic field for configuring an operating point of the first circuit based on a current flow through the field line, wherein impedance of one or more of the magnetic tunnel junctions in each of the plurality of rows of each subarray of magnetic tunnel junctions included in the first circuit is configured based on the first magnetic field.

In one embodiment of the apparatus, one or more of the magnetic tunnel junctions in each of the plurality of rows of each subarray of magnetic tunnel junctions included in the first circuit is a first subset of the magnetic tunnel junctions in each of the plurality of rows of each subarray of magnetic tunnel junctions included in the first circuit. The field line may be a first field line (such as field line 1012A of FIG. 13) and the current flow may be a first current flow. In one embodiment, the apparatus further comprises a second field line (such as field line 1012B of FIG. 13) configured to generate a second magnetic field for configuring the operating point of the first circuit based on a second current flow through the second field line. Impedance of a second subset of the magnetic tunnel junctions in each of the plurality of rows of each subarray of magnetic tunnel junctions included in the first circuit may be configured based on the second magnetic field, and the second subset may be distinct from the first subset. The first field line and the second field line may be serpentine.

In one embodiment of the apparatus, the apparatus further comprises a first conductive layer including a first section (such as the section 1310A of FIG. 13), a second section physically separated from the first section, and a third section physically separated from the first section and the second section, wherein: the plurality of subarrays include a first subarray and a second subarray adjacent to the first subarray; the first subarray is disposed between the first section and the third section; and the second subarray is disposed between the second section and the third section. The third section may be disposed between the first subarray and the second subarray. The third section may be displaced from each of the first section and the second section in a first direction, and the third section may be substantially parallel to the first section and the second section. The first section may be displaced from the second section in a second direction substantially perpendicular to the first direction.

In one embodiment of the apparatus, the field line (such as the field line 612 or the field lines 1012 of FIGS. 12 and 13) may have a plurality of portions including a first portion (such as portion 622A of the field line 612 of FIG. 6) and a second portion (such as portion 622B of the field line 612 of FIG. 6); the current flow is a first current flow through the first portion of the field line; and a direction of the first current flow through the first portion of the field line is substantially perpendicular to the first direction (such as in the embodiment of FIGS. 12 and 13). The direction of the first current flow through the first portion of the field line may be substantially perpendicular to a direction of a second current flow through one or more of the plurality of rows of the first subarray (such as row 1202A of subarray 1201A of FIG. 13), and to a direction of a third current flow through one or more of the plurality of rows of the second subarray (such as subarray 1201B of FIG. 13). The direction of the second current flow through the one or more of the plurality of rows of the first subarray may be substantially opposite to the direction of the third current flow through the one or more of the plurality of rows of the second subarray (such as subarray 1311 of FIG. 13).

In one embodiment of the apparatus, the field line is configured to generate a second magnetic field for configuring an operating point of the second circuit based on the first current flow through the second portion of the field line; and a direction of the first current flow through the second portion of the field line is substantially opposite to the direction of the first current flow through the first portion of the field line. The apparatus may be configured to generate a differential signal, the differential signal being a difference between a first output signal of the first circuit (such as the magnetic field sensing module 200A of FIGS. 12 and 13) and a second output signal of the second circuit (such as the magnetic field sensing module 200E of FIGS. 12 and 13), wherein a magnitude of the differential signal is increased relative to the first output signal and the second output signal. The apparatus may be configured to generate the differential signal for suppression of common mode noise.

In one embodiment, the apparatus further comprises a second conductive layer and a third conductive layer, wherein: the magnetic tunnel junctions in one or more of the plurality of rows included in the first subarray are disposed between the second conductive layer (such as the conductive layer 1101 of FIG. 11) and the third conductive layer (such as the conductive layer 1103 of FIG. 11); a current flow through the magnetic tunnel junctions in the one or more of the plurality of rows included in the first subarray traverses the second conductive layer and the third conductive layer; and the second conductive layer and the third conductive layer are oriented in a second direction substantially the same as the first direction.

In one embodiment of the apparatus, a first number of the magnetic tunnel junctions in each of the plurality of rows are connected in series; a second number of the plurality of subarrays are connected in series; and a product of the first number and the second number (such as Ns_sub*G of FIG. 13) is configured such that a voltage across each magnetic tunnel junction included in the array of magnetic tunnel junctions is in the range from about 0.25 volts to about 0.5 volts. Impedance of the array of magnetic tunnel junctions may be in the range from about 2 kiloohms to about 8 kiloohms, and a voltage across the array of magnetic tunnel junctions may be in the range from about 20 volts to about 40 volts. A first number of the magnetic tunnel junctions in each of the plurality of rows (such as Ns_sub of FIG. 13) may be in the range from about 2 to about 8. A second number of the plurality of subarrays connected in series (such as G of FIG. 13) may be in the range from about 10 to about 40. A product of the first number and the second number (such as Ns_sub*G of FIG. 13) may be in the range from about 80 to about 160. A third number of the plurality of rows connected in parallel (such as Np_sub of FIG. 13) in each of the plurality of subarrays may be in the range from about 20 to about 40.

In one embodiment of the apparatus, a first number of the magnetic tunnel junctions in each of the plurality of rows are connected in series; a second number of the plurality of subarrays are connected in series; a third number of the plurality of rows are connected in parallel in the corresponding one of the plurality of subarrays; and a ratio of a product of the first number and the second number to the third number (Ns_sub*G/Np_sub of FIG. 13) is in the range from about 2 to about 4.

In one embodiment, an apparatus comprises a plurality of circuits including a first circuit and a second circuit, each of the plurality of circuits including a plurality of subarrays (such as the subarrays 1501 of FIGS. 15 and 16) of magnetic tunnel junctions, wherein: the magnetic tunnel junctions in each of the plurality of subarrays are arranged in a plurality of rows (such as the rows 1502 of FIGS. 15 and 16), the magnetic tunnel junctions in each of the plurality of rows are connected in series, and the plurality of rows are connected in parallel; and the plurality of subarrays are connected in series. The apparatus further comprises a field line (such as the field line 612 or the field lines 1012 of FIGS. 15 and 16) configured to generate a first magnetic field for configuring an operating point of the first circuit based on a current flow through the field line, wherein impedance of a subset of the plurality of rows in each subarray of magnetic tunnel junctions included in the first circuit is configured based on the first magnetic field.

In one embodiment of the apparatus, the field line may be a first field line (such as field line 1012A of FIG. 16) and the current flow may be a first current flow. In one embodiment, the apparatus further comprises a second field line (such as field line 1012B of FIG. 16) configured to generate a second magnetic field for configuring the operating point of the first circuit based on a second current flow through the second field line. The subset may be a first subset. Impedance of a second subset of the magnetic tunnel junctions in each of the plurality of rows of each subarray of magnetic tunnel junctions included in the first circuit may be configured based on the second magnetic field, and the second subset may be distinct from the first subset. The first field line and the second field line may be serpentine.

In one embodiment of the apparatus, the apparatus further comprises a first conductive layer including a first section (such as the section 1610A of FIG. 16), a second section physically separated from the first section, and a third section physically separated from the first section and the second section, wherein: the plurality of subarrays include a first subarray and a second subarray adjacent to the first subarray; the first subarray is disposed between the first section and the third section; and the second subarray is disposed between the second section and the third section. The third section may be disposed between the first subarray and the second subarray. The third section may be displaced from each of the first section and the second section in a first direction, and the third section may be substantially parallel to the first section and the second section.

In one embodiment of the apparatus, the third section (such as the section 1610B of FIG. 16) may be displaced from the first section in a first direction; the third section may be displaced from the second section (such as the section 1610C of FIG. 16) in a second direction substantially opposite to the first direction; and the third section may be substantially parallel to the first section and the second section. The second section may be displaced from the first section in a third direction substantially the same as the first direction.

In one embodiment of the apparatus, the field line (such as the field line 612 or the field lines 1012 of FIGS. 15 and 16) may have a plurality of portions including a first portion (such as portion 622A of the field line 612 of FIG. 6) and a second portion (such as portion 622B of the field line 612 of FIG. 6); the current flow is a first current flow through the first portion of the field line; and a direction of the first current flow through the first portion of the field line is substantially parallel to the first direction (such as in the embodiment of FIGS. 15 and 16). The direction of the first current flow through the first portion of the field line may be substantially parallel to a direction of a second current flow through one or more of the plurality of rows of the first subarray (such as row 1502A of subarray 1501A of FIG. 16), and to a direction of a third current flow through one or more of the plurality of rows of the second subarray (such as subarray 1501B of FIG. 16). The direction of the second current flow through the one or more of the plurality of rows of the first subarray may be substantially parallel to the direction of the third current flow through the one or more of the plurality of rows of the second subarray.

In one embodiment of the apparatus, the field line is configured to generate a second magnetic field for configuring an operating point of the second circuit based on the first current flow through the second portion of the field line; and a direction of the first current flow through the second portion of the field line is substantially opposite to the direction of the first current flow through the first portion of the field line. The apparatus may be configured to generate a differential signal, the differential signal being a difference between a first output signal of the first circuit (such as the magnetic field sensing module 200A of FIGS. 15 and 16) and a second output signal of the second circuit (such as the magnetic field sensing module 200E of FIGS. 15 and 16), wherein a magnitude of the differential signal is increased relative to the first output signal and the second output signal. The apparatus may be configured to generate the differential signal for suppression of common mode noise.

In one embodiment, the apparatus further comprises a second conductive layer and a third conductive layer, wherein: the magnetic tunnel junctions in one or more of the plurality of rows included in the first subarray are disposed between the second conductive layer (such as the conductive layer 1801 of FIG. 18) and the third conductive layer (such as the conductive layer 1803 of FIG. 18); a current flow through the magnetic tunnel junctions in the one or more of the plurality of rows included in the first subarray traverses the second conductive layer and the third conductive layer; and the second conductive layer and the third conductive layer are oriented in a second direction substantially the same as the first direction.

In one embodiment of the apparatus, a first number of the magnetic tunnel junctions in each of the plurality of rows are connected in series; a second number of the plurality of subarrays are connected in series; and a product of the first number and the second number (such as Ns_sub*G of FIG. 16) is configured such that a voltage across each magnetic tunnel junction included in the array of magnetic tunnel junctions is in the range from about 0.25 volts to about 0.5 volts. Impedance of the array of magnetic tunnel junctions may be in the range from about 50 kiloohms to about 100 kiloohms, and a voltage across the array of magnetic tunnel junctions may be in the range from about 50 volts to about 100 volts. A first number of the magnetic tunnel junctions in each of the plurality of rows (such as Ns_sub of FIG. 16) may be in the range from about 5 to about 40. A second number of the plurality of subarrays connected in series (such as G of FIG. 13) may be in the range from about 5 to about 40. A product of the first number and the second number (such as Ns_sub*G of FIG. 16) may be in the range from about 200 to about 400. A third number of the plurality of rows connected in parallel (such as Np_sub of FIG. 13) in each of the plurality of subarrays may be in the range from about 4 to about 8.

In one embodiment of the apparatus, a first number of the magnetic tunnel junctions in each of the plurality of rows are connected in series; a second number of the plurality of subarrays are connected in series; a third number of the plurality of rows are connected in parallel in the corresponding one of the plurality of subarrays; and a ratio of a product of the first number and the second number to the third number (Ns_sub*G/Np_sub of FIG. 16) is in the range from about 45 to about 55.

In one embodiment, an apparatus comprises a plurality of groups of magnetic tunnel junctions (examples of the magnetic field sensing elements 102), wherein the magnetic tunnel junctions in each group are arranged in a plurality of rows, the magnetic tunnel junctions in each of the plurality of rows are connected in series, and the plurality of rows are connected in parallel. The apparatus further comprises a first conductive layer (such as the first conductive layer 1101 of FIG. 11 or the first conductive layer 1801 of FIG. 18) including a plurality of conductive interconnects; a second conductive layer (such as the second conductive layer 1103 of FIG. 11 or the second conductive layer 1803 of FIG. 18) including a plurality of straps; and a third conductive layer (such as the third conductive layer 1105 of FIG. 11 or the third conductive layer 1805 of FIG. 18) including a plurality of field lines (such as the field line 612 or the field lines 1012 of FIGS. 9, 10, 12, 13, 15, and 16), each of the plurality of field lines configured to generate a magnetic field for configuring an operating point of a corresponding subset of the magnetic tunnel junctions in each group based on a current flow through each of the plurality of field lines. The magnetic tunnel junctions in each group is disposed between and connected to a corresponding one of the plurality of conductive interconnects and a corresponding one of the plurality of straps. The second conductive layer is disposed between the first conductive layer and the third conductive layer. Each of the plurality of field lines may be serpentine. Each of the plurality of groups of magnetic tunnel junctions may be a subarray of magnetic tunnel junctions (such as the subarrays 1201 of FIGS. 12 and 13 or the subarrays 1501 of FIGS. 15 and 16). The plurality of groups of magnetic tunnel junctions may be connected in series.

In one embodiment, the apparatus further comprises a fourth conductive layer (such as the fourth conductive layer 1120 of FIG. 11 or the fourth conductive layer 1820 of FIG. 18) including a plurality of sections, wherein the plurality of rows in each group are disposed between and connected to a corresponding pair of sections included in the plurality of sections. The plurality of groups may include a first group and a second group. The plurality of sections may include a first section, a second section, and a third section. For the first group, the corresponding pair of sections may include the first section and the third section. For the second group, the corresponding pair of sections may include the second section and the third section. The third section may be connected to the plurality of rows in the first group and the plurality of rows in the second group. The third section may be disposed between the first section and the second section. The third section may be displaced from each of the first section and the second section in a first direction. The third section may be substantially parallel to the first section and the second section. The first section may be displaced from the second section in a second direction substantially perpendicular to the first direction.

In one embodiment of the apparatus, impedance of the plurality of groups of magnetic tunnel junctions connected in series is in the range from about 2 kiloohms to about 8 kiloohms; and a voltage across the plurality of groups of magnetic tunnel junctions connected in series is in the range from about 20 volts to about 40 volts.

In one embodiment of the apparatus, impedance of the plurality of groups of magnetic tunnel junctions connected in series is in the range from about 50 kiloohms to about 100 kiloohms; and a voltage across the plurality of groups of magnetic tunnel junctions connected in series is in the range from about 50 volts to about 100 volts.

In one embodiment of the apparatus, the third section may be a ground pad (such as the ground pad 903 of FIG. 10 or the ground pad 1203 of FIG. 12) disposed between the first section and the second section.

In one embodiment of the apparatus, each of the plurality of straps may be formed of a different material than each of the plurality of conductive interconnects. Each of the plurality of straps may be thinner than each of the plurality of conductive interconnects.

In one embodiment of the apparatus, the plurality of groups may include a first group and a second group. Each of the plurality of field lines may include a first portion (such as portion 622A of the field line 612 of FIG. 6) configured to generate the magnetic field for configuring the operating point of the corresponding subset of the magnetic tunnel junctions in the first group based on the current flow through the first portion of each of the plurality of field lines. The first portions of the plurality of field lines may be substantially parallel (such as the field lines 1012 of FIGS. 9, 10, 12, 13, 15, and 16). Each of the plurality of field lines may include a second portion (such as portion 622B of the field line 612 of FIG. 6) configured to generate the magnetic field for configuring the operating point of the corresponding subset of the magnetic tunnel junctions in the second group based on the current flow through the second portion of each of the plurality of field lines. The second portions of the plurality of field lines may be substantially parallel to the first portions of the plurality of field lines. A direction of the current flow through the first portion of each of the plurality of field lines may be substantially opposite to a direction of the current flow through the second portion of each of the plurality of field lines.

In one embodiment, the apparatus further comprises a fourth conductive layer (such as the fourth conductive layer 1120 of FIG. 11 or the fourth conductive layer 1820 of FIG. 18) including a conductive pad, wherein: the first portions of the plurality of field lines (such as portion 1022A of field line 1012A and portion 1023A of field line 1012B in FIGS. 10, 13, and 16) are connected in parallel; the second portions of the plurality of field lines (such as portion 1022B of field line 1012A and portion 1023B of field line 1012B in FIGS. 10, 13, and 16) are connected in parallel; and the first portions of the plurality of field lines are connected to the second portions of the plurality of field lines by the conductive pad (such as conductive pad 1030 in FIGS. 10, 13, and 16).

In one embodiment, each of the plurality of field lines may include a second portion configured to generate the magnetic field for configuring the operating point of the corresponding subset of the magnetic tunnel junctions in the second group based on the current flow through the second portion of each of the plurality of field lines. The second portions of the plurality of field lines may be substantially parallel. The second portions of the plurality of field lines (such as portion 622C of the field line 612 of FIG. 6) may not be substantially parallel to the first portions of the plurality of field lines.

In one embodiment, a direction of the current flow through the first portion of each of the plurality of field lines may be substantially perpendicular to a direction of a current flow through each of the plurality of rows in the first group.

In one embodiment, a direction of the current flow through the first portion of each of the plurality of field lines may be substantially perpendicular to a direction of a current flow through each of the plurality of rows in the first group.

In one embodiment, a direction of the current flow through the first portion of each of the plurality of field lines may be substantially parallel to a direction of a current flow through each of the plurality of rows in the first group.

In one embodiment, a direction of the current flow through the first portion of each of the plurality of field lines may be substantially opposite to a direction of a current flow through each of the plurality of rows in the first group.

Figure 19:
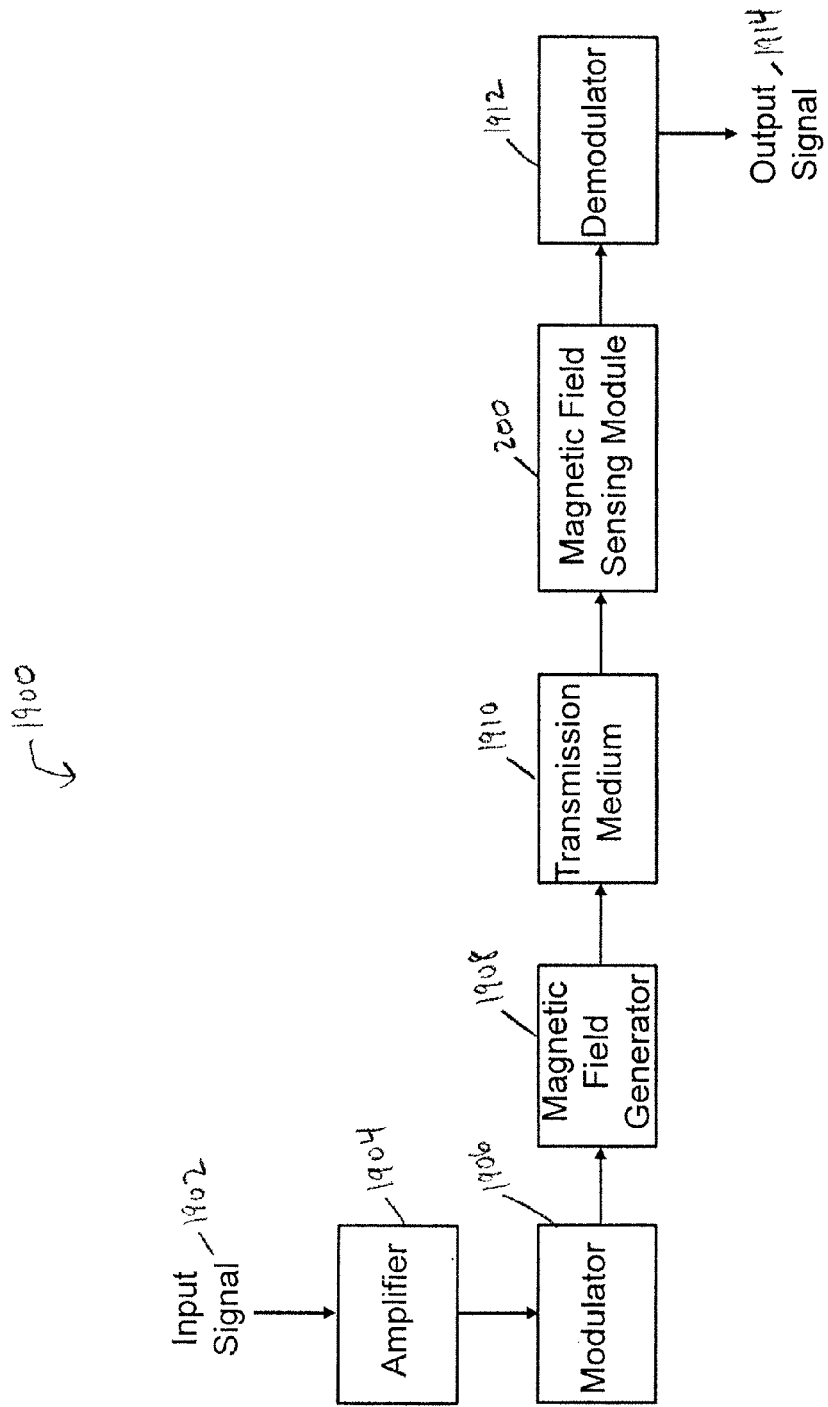
FIG. 19 illustrates a logical block diagram of a system for transmission and reception of a signal encoded in a quadrature modulated magnetic field, according to an embodiment of the invention.

FIG. 19 illustrates a logical block diagram of a system 1900 for transmission and reception of a signal encoded in a quadrature modulated magnetic field, according to an embodiment of the invention. An input signal 1902 is amplified by amplifier 1904, then is applied to modulator 1906. The modulated output of the modulator 1906 is applied to magnetic field generator 1908 to generate a modulated magnetic field that propagates over transmission medium 1910. The magnetic field is received and sensed by the magnetic field sensing module 200 (previously described with reference to FIGS. 1-18). The output of the magnetic field sensing module 200 is then demodulated by demodulator 1912 to obtain output signal 1914.

There are various potential applications for the system 1900, such as underwater communication, near-field communication, communication over local area networks (LANs), direct broadcast, and flashing (such as for secure wireless firmware updates). As the communication is over a magnetic field rather than an electrical field, there can be advantages such as enhanced security and immunity to RF interference. The bandwidth of the input signal 1902 and the output signal 1914 can be in the tens of MHz or higher, such as in the GHz range, as the frequency response of the magnetic field sensing elements 102 (see FIG. 1) included in the magnetic field sensing module 200 can be in those ranges. The system 1900 can therefore be used, for example, for transmitting audio, video, and data. The magnetic field sensing module 200 also detects the magnetic field, including amplitude, phase, and directional information. This enables use of modulation approaches that encode the input signal 1902 in either or both the amplitude and phase of the modulated signal, such as but not limited to quadrature amplitude modulation. This is an advantage of the magnetic field sensing module 200 over a solenoid, which detects magnetic flux and can lose phase information in the received magnetic field. Also, the magnetic field sensing module 200 can act as a magnetic antenna, so a separate coil is not needed. The separate coil can be costly, bulky, and senses in only one direction, while the magnetic field sensing module 200 can sense in multiple directions.

In one embodiment, the magnetic field sensing module 200 may be a portion of the magnetic field sensing device 600 of FIG. 6, such as the magnetic field sensing module 200A. Alternatively, the system 1900 may include the magnetic field sensing device 600 of FIG. 6 (which includes multiple magnetic field sensing modules 200 at different angular orientations) for sensing the transmitted magnetic field. The system 1900 may include additional modules, such as those described in the context of FIG. 5. Any of the various structures described in FIGS. 1-18 for magnetic field sensing can be used as the magnetic field sensing module for the system 1900.

In one embodiment, an apparatus comprises a circuit (such as the magnetic field sensing module 200 of FIG. 19) including multiple magnetic tunnel junctions (examples of magnetic field sensing elements 102 of FIG. 1), the circuit configured to convert a quadrature modulated magnetic field to a quadrature modulated electrical signal, each magnetic tunnel junction including a storage layer having a storage magnetization and a sense layer having a sense magnetization, each magnetic tunnel junction being configured such that the sense magnetization and impedance of each magnetic tunnel junction vary in response to the quadrature modulated magnetic field. The apparatus further comprises a module configured to demodulate the quadrature modulated electrical signal to recover a signal encoded in the quadrature modulated magnetic field. The circuit may be a first circuit and the quadrature modulated electrical signal may be a first quadrature modulated electrical signal. The apparatus may further comprise a second circuit (such as the magnetic field sensing module 200E of FIG. 6) including multiple magnetic tunnel junctions, the circuit configured to convert the quadrature modulated magnetic field to a second quadrature modulated electrical signal. The module (such as the demodulator 1912 of FIG. 19) may be configured to perform combining based on the first quadrature modulated electrical signal and the second quadrature modulated electrical signal to recover the signal. The combining may be one of equal-gain combining, maximal-ratio combining, switched combining, and selection combining, or any other form of diversity combining known to one of ordinary skill in the art. The advantages are realized with immunity to eavesdropping and rate of decay of a magnetic signal over distance.

In one embodiment of the apparatus, an operating point of the circuit is configured such that for a first subset of the multiple magnetic tunnel junctions, the sense magnetization is substantially aligned with the storage magnetization at the operating point, and for a second subset of the multiple magnetic tunnel junctions, the sense magnetization is substantially anti-aligned with the storage magnetization at the operating point.

In one embodiment of the apparatus, each magnetic tunnel junction is configured such that impedance of each magnetic tunnel junction varies in response to an amplitude and a phase and frequency of the quadrature modulated magnetic field. The signal may be an audio signal. The signal may be a media signal including one or more of a video signal and an audio signal.

In one embodiment of the apparatus, the quadrature modulated electrical signal may be quadrature amplitude modulated. The quadrature modulated electrical signal may be quadrature amplitude modulated based on one of a 16-QAM constellation, a 64-QAM constellation, and a 256-QAM constellation, or on any other QAM constellation known to one of ordinary skill in the art.

In one embodiment, the apparatus further comprises a first plurality of circuits, wherein: the circuit is a first circuit; a second plurality of circuits includes the first circuit and the first plurality of circuits; each of the second plurality of circuits (such as the magnetic field sensing modules 200A-200H of FIG. 6) has a distinct angular orientation; and each of the first plurality of circuits includes multiple magnetic tunnel junctions, each magnetic tunnel junction being configured such that impedance of each magnetic tunnel junction varies in response to the quadrature modulated magnetic field. The apparatus may further comprise a field line (such as the field line 612 of FIG. 6 or the field lines 1012 of FIGS. 9, 10, 12, 13, 15, and 16) configured to generate a magnetic field for configuring an operating point of each of the second plurality of circuits based on a current flow through the field line, wherein the field line includes a plurality of portions, each of the plurality of portions disposed adjacent to a corresponding one of the second plurality of circuits, and each of the plurality of portions being configured such that the current flow through each of the plurality of portions has an angular orientation corresponding to the distinct angular orientation of the corresponding one of the second plurality of circuits. The angular orientations of the plurality of portions of the field line may be substantially equally spaced. The plurality of portions of the field line may include N portions (such as portions 622A, 622B, and 622C of the field line 612 of FIG. 6), wherein N is at least three. The angular orientations of the plurality of portions of the field line may be substantially equally spaced by an angle of 360 degrees divided by N.

In one embodiment, the plurality of portions of the field line may include a first portion and a second portion. The current flow through the first portion may be in a substantially opposite direction to the current flow through the second portion. The first plurality of circuits may include a second circuit. The field line may be configured to generate the magnetic field for configuring an operating point of the first circuit based on the current flow through the first portion of the field line. The field line may be configured to generate the magnetic field for configuring an operating point of the second circuit based on the current flow through the second portion of the field line.

In one embodiment, the apparatus may be configured to generate a differential signal, the differential signal being a difference between a first output signal of the first circuit (such as the magnetic field sensing module 200A of FIGS. 6, 9, 10, 12, 13, 15, and 16) and a second output signal of the second circuit (such as the magnetic field sensing module 200E of FIGS. 6, 9, 10, 12, 13, 15, and 16), wherein a magnitude of the differential signal is increased relative to the first output signal and the second output signal. The apparatus may be configured to generate the differential signal for suppression of common mode noise.

In one embodiment, the operating point of each of the second plurality of circuits is configured to substantially maximize gain of the corresponding one of the second plurality of circuits.

In one embodiment, the operating point of each of the second plurality of circuits is configured to maintain substantially linear operation of the corresponding one of the second plurality of circuits.

Figure 20:
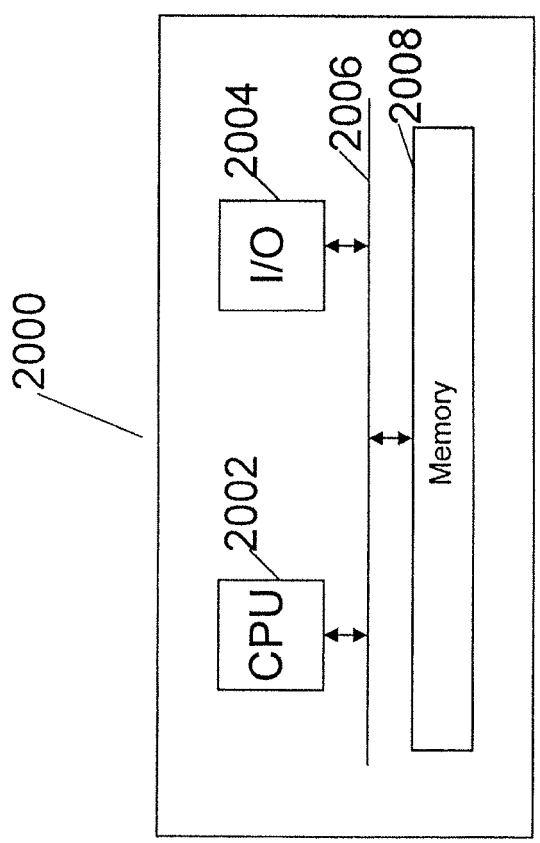
FIG. 20 illustrates an apparatus configured in accordance with one embodiment of the present invention.

FIG. 20 illustrates an apparatus 2000 configured in accordance with one embodiment of the present invention. The apparatus includes a central processing unit (CPU) 2002 connected to a bus 2006. Input/output devices 2004 may also be connected to the bus 2006, and may include a keyboard, mouse, display, and the like. An executable program representing a magnetic field determination module 502 (see FIG. 5) as described above can be stored in memory 2008. Executable programs representing other modules included in the magnetic field sensing devices 500 and 600 (see FIGS. 5 and 6) can also be stored in the memory 2008.

Figure 21:
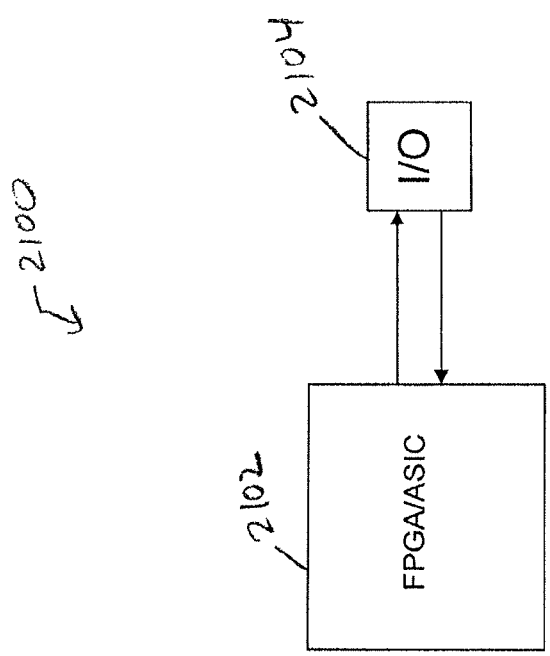
FIG. 21 illustrates an apparatus configured in accordance with another embodiment of the present invention.

FIG. 21 illustrates an apparatus 2100 configured in accordance with another embodiment of the present invention. The apparatus 2100 includes a field programmable gate array (FPGA) and/or an application specific integrated circuit (ASIC) 2102 that implements the operations of the magnetic field determination module 502 and/or other modules included in the magnetic field sensing devices 500 and 600 (see FIGS. 5 and 6). The FPGA/ASIC 2102 may be configured by and may provide output to input/output devices 2104.

An embodiment of the invention relates to a computer-readable storage medium having computer code thereon for performing various computer-implemented operations. The term "computer-readable storage medium" is used herein to include any medium that is capable of storing or encoding a sequence of instructions or computer codes for performing the operations described herein. The media and computer code may be those specially designed and constructed for the purposes of the invention, or they may be of the kind well known and available to those having skill in the computer software arts. Examples of computer-readable storage media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits ("ASICs"), programmable logic devices ("PLDs"), and ROM and RAM devices. Examples of computer code include machine code, such as produced by a compiler, and files containing higher-level code that are executed by a computer using an interpreter or a compiler. For example, an embodiment of the invention may be implemented using Java, C++, or other object-oriented programming language and development tools. Additional examples of computer code include encrypted code and compressed code. Moreover, an embodiment of the invention may be downloaded as a computer program product, which may be transferred from a remote computer (e.g., a server computer) to a requesting computer (e.g., a client computer or a different server computer) via a transmission channel. Another embodiment of the invention may be implemented in hardwired circuitry in place of, or in combination with, machine-executable software instructions.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. An apparatus, comprising:
a plurality of circuits, each of the plurality of circuits including an array of magnetic tunnel junctions partitioned into a plurality of subarrays, wherein:
the magnetic tunnel junctions in each of the plurality of subarrays are arranged in a plurality of rows, the magnetic tunnel junctions in each of the plurality of rows are connected in series, and the plurality of rows are connected in parallel;
the plurality of subarrays are connected in series; and
each magnetic tunnel junction includes a storage layer having a storage magnetization and a sense layer having a sense magnetization, each magnetic tunnel junction being configured such that the sense magnetization and impedance of each magnetic tunnel junction vary in response to an external magnetic field; and
a module configured to determine the external magnetic field based on a parameter of each of the plurality of circuits, wherein the parameter of each of the plurality of circuits varies based on a combined impedance of the multiple magnetic tunnel junctions, the module being implemented in at least one of a memory or a processing device; wherein:
the magnetic tunnel junctions in one or more of the plurality of rows are disposed between a first conductive layer and a second conductive layer including a strap;
a first magnetic tunnel junction, a second magnetic tunnel junction, and a third magnetic tunnel junction disposed between the first magnetic tunnel junction and the second magnetic tunnel junction are included in the magnetic tunnel junctions in the one or more of the plurality of rows;
the first magnetic tunnel junction and the third magnetic tunnel junction are connected to a portion of the first conductive layer; and
the second magnetic tunnel junction and the third magnetic tunnel junction are connected to the strap.

2. The apparatus of claim 1, wherein:
the strap is formed of a different material than the first conductive layer; and
the strap is thinner than the first conductive layer.

3. An apparatus, comprising:
a plurality of circuits, each of the plurality of circuits including an array of magnetic tunnel junctions partitioned into a plurality of subarrays, wherein:
the magnetic tunnel junctions in each of the plurality of subarrays are arranged in a plurality of rows, the magnetic tunnel junctions in each of the plurality of rows are connected in series, and the plurality of rows are connected in parallel;
the plurality of subarrays are connected in series; and
each magnetic tunnel junction includes a storage layer having a storage magnetization and a sense layer having a sense magnetization, each magnetic tunnel junction being configured such that the sense magnetization and impedance of each magnetic tunnel junction vary in response to an external magnetic field;
a module configured to determine the external magnetic field based on a parameter of each of the plurality of circuits, wherein the parameter of each of the plurality of circuits varies based on a combined impedance of the multiple magnetic tunnel junctions, the module being implemented in at least one of a memory or a processing device; and
a first conductive layer including a first section, a second section physically separated from the first section, and a third section physically separated from the first section and the second section, wherein:
the plurality of subarrays include a first subarray and a second subarray adjacent to the first subarray;
the first subarray is disposed between the first section and the third section; and
the second subarray is disposed between the second section and the third section.

4. The apparatus of claim 3, wherein the third section is disposed between the first subarray and the second subarray.

5. The apparatus of claim 3, wherein:
the third section is displaced from each of the first section and the second section in a first direction; and
the third section is substantially parallel to the first section and the second section.

6. The apparatus of claim 5, wherein the first section is displaced from the second section in a second direction substantially perpendicular to the first direction.

7. The apparatus of claim 5, further comprising a field line configured for a first current flow to traverse the field line and having a plurality of portions including a first portion and a second portion, wherein:
the plurality of circuits include a first circuit and a second circuit;
the field line is configured to generate a first magnetic field for configuring an operating point of the first circuit based on the first current flow through the first portion of the field line; and
a direction of the first current flow through the first portion of the field line is substantially perpendicular to the first direction.

8. The apparatus of claim 7, wherein the direction of the first current flow through the first portion of the field line is substantially perpendicular to a direction of a second current flow through one or more of the plurality of rows of the first subarray, and to a direction of a third current flow through one or more of the plurality of rows of the second subarray.

9. The apparatus of claim 8, wherein the direction of the second current flow through the one or more of the plurality of rows of the first subarray is substantially opposite to the direction of the third current flow through the one or more of the plurality of rows of the second subarray.

10. The apparatus of claim 7, wherein:
the field line is configured to generate a second magnetic field for configuring an operating point of the second circuit based on the first current flow through the second portion of the field line; and
a direction of the first current flow through the second portion of the field line is substantially opposite to the direction of the first current flow through the first portion of the field line.

11. The apparatus of claim 10, wherein the apparatus is configured to generate a differential signal, the differential signal being a difference between a first output signal of the first circuit and a second output signal of the second circuit, wherein a magnitude of the differential signal is increased relative to the first output signal and the second output signal.

12. The apparatus of claim 11, wherein the apparatus is configured to generate the differential signal for suppression of common mode noise.

13. The apparatus of claim 5, further comprising a second conductive layer and a third conductive layer, wherein:
the magnetic tunnel junctions in one or more of the plurality of rows included in the first subarray are disposed between the second conductive layer and the third conductive layer;
a current flow through the magnetic tunnel junctions in the one or more of the plurality of rows included in the first subarray traverses the second conductive layer and the third conductive layer; and the second conductive layer and the third conductive layer are oriented in a second direction substantially the same as the first direction.

14. The apparatus of claim 3, wherein:
the third section is displaced from the first section in a first direction;
the third section is displaced from the second section in a second direction substantially opposite to the first direction; and
the third section is substantially parallel to the first section and the second section.

15. The apparatus of claim 14, wherein the second section is displaced from the first section in a third direction substantially the same as the first direction.

16. The apparatus of claim 14, further comprising a field line configured for a first current flow to traverse the field line and having a plurality of portions including a first portion and a second portion, wherein:
the plurality of circuits include a first circuit and a second circuit;
the field line is configured to generate a first magnetic field for configuring an operating point of the first circuit based on the first current flow through the first portion of the field line; and
a direction of the first current flow through the first portion of the field line is substantially parallel to the first direction.

17. The apparatus of claim 16, wherein the direction of the first current flow through the first portion of the field line is substantially parallel to a direction of a second current flow through one or more of the plurality of rows of the first subarray, and to a direction of a third current flow through one or more of the plurality of rows of the second subarray.

18. The apparatus of claim 17, wherein the direction of the second current flow through the one or more of the plurality of rows of the first subarray is substantially the same as the direction of the third current flow through the one or more of the plurality of rows of the second subarray.

19. The apparatus of claim 16, wherein:
the field line is configured to generate a second magnetic field for configuring an operating point of the second circuit based on the first current flow through the second portion of the field line; and
a direction of the first current flow through the second portion of the field line is substantially opposite to the direction of the first current flow through the first portion of the field line.

20. The apparatus of claim 19, wherein the apparatus is configured to generate a differential signal, the differential signal being a difference between a first output signal of the first circuit and a second output signal of the second circuit, wherein a magnitude of the differential signal is increased relative to the first output signal and the second output signal.

21. The apparatus of claim 20, wherein the apparatus is configured to generate the differential signal for suppression of common mode noise.

22. The apparatus of claim 14, further comprising a second conductive layer and a third conductive layer, wherein:
the magnetic tunnel junctions in one or more of the plurality of rows included in the first subarray are disposed between the second conductive layer and the third conductive layer;
a current flow through the magnetic tunnel junctions in the one or more of the plurality of rows included in the first subarray traverses the second conductive layer and the third conductive layer; and
the second conductive layer and the third conductive layer are oriented in a third direction substantially the same as the first direction.

* * * * *